United States Patent
Toshima et al.

(10) Patent No.: US 8,235,061 B2
(45) Date of Patent: Aug. 7, 2012

(54) SUBSTRATE PROCESSING APPARATUS AND SUBSTRATE PROCESSING METHOD

(75) Inventors: Takayuki Toshima, Koshi (JP); Kazuo Terada, Koshi (JP); Kazuyuki Honda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 171 days.

(21) Appl. No.: 12/824,565

(22) Filed: Jun. 28, 2010

(65) Prior Publication Data

US 2011/0000512 A1 Jan. 6, 2011

(30) Foreign Application Priority Data

Jul. 1, 2009 (JP) ................. 2009-157255

(51) Int. Cl.
*B08B 3/08* (2006.01)
*B08B 3/10* (2006.01)

(52) U.S. Cl. ........ 134/61; 134/115 R; 134/105; 134/902

(58) Field of Classification Search .................... 134/61, 134/95.2, 115 R, 902; 34/90, 91, 189, 236, 34/242

See application file for complete search history.

(56) References Cited

U.S. PATENT DOCUMENTS 6,334,266 B1 * 1/2002 Moritz et al. ................... 34/337
2005/0224102 A1 * 10/2005 Kim ............................ 134/94.1

FOREIGN PATENT DOCUMENTS

JP 2008-072118 A 3/2008

* cited by examiner

*Primary Examiner* — Michael Kornakov
*Assistant Examiner* — Natasha Campbell
(74) *Attorney, Agent, or Firm* — Abelman, Frayne & Schwab

(57) ABSTRACT

Provided are a substrate processing apparatus and a substrate processing method capable of processing of a substrate using a supercritical fluid without exposing the pattern formed on the substrate to an atmospheric environment. The substrate processing apparatus includes a cleaning bath configured to accommodate a substrate and clean the substrate by flowing a cleaning solution, and a processing vessel configured to accommodate the cleaning bath and process the substrate with a supercritical fluid.

15 Claims, 16 Drawing Sheets

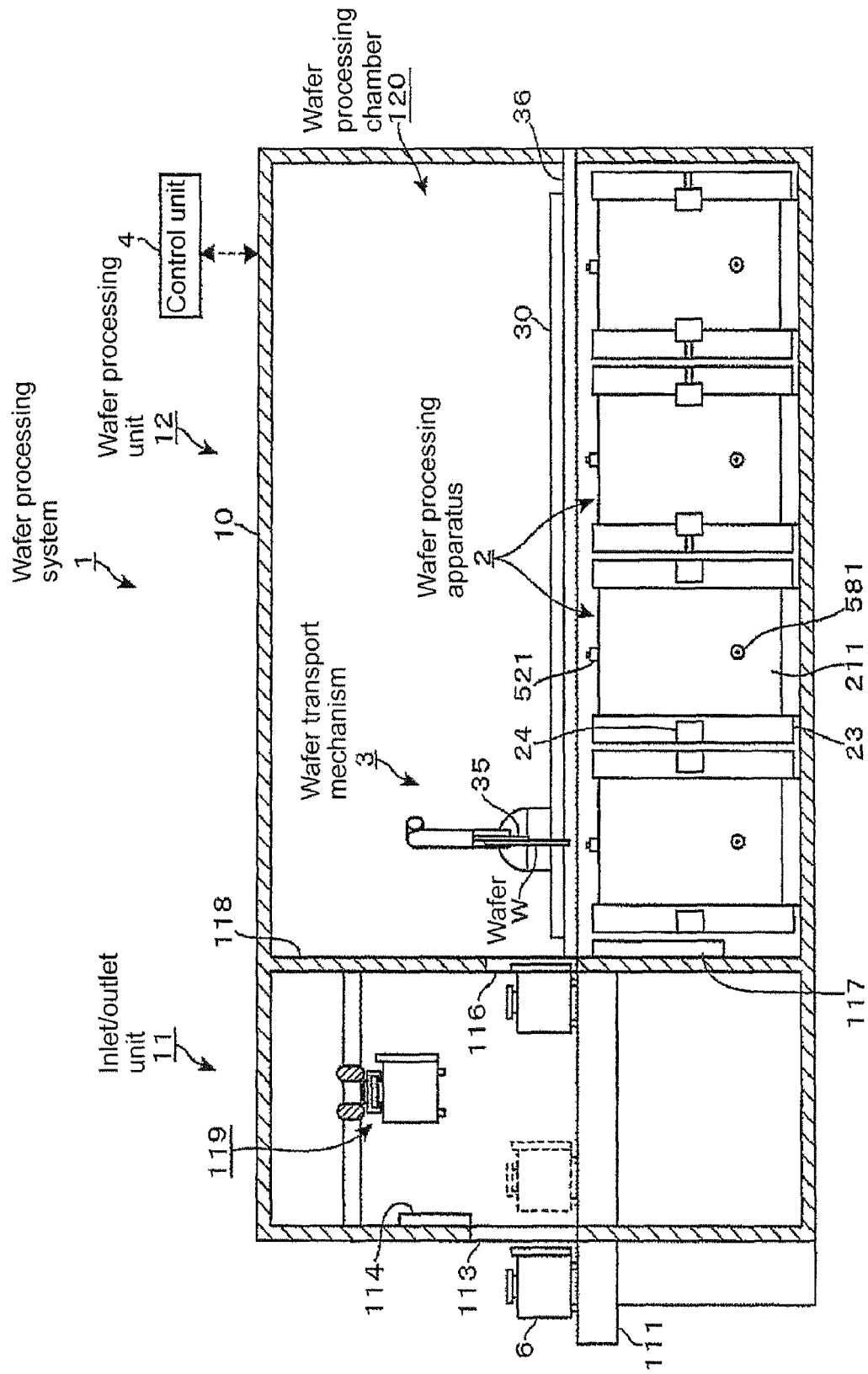

Discharge | IPA, Chemical solution, Rinse solution | Discharge

Discharge | HFE | Discharge

Discharge | Purge gas | Discharge

SUBSTRATE PROCESSING APPARATUS AND SUBSTRATE PROCESSING METHOD

This application is based on and claims priority from Japanese Patent Application No. 2009-157255, filed on Jul. 1, 2009, with the Japanese Patent Office, the disclosure of which is incorporated herein in its entirety by reference.

TECHNICAL FIELD

The present disclosure relates to a technique for performing a liquid processing such as a cleaning process, onto a substrate such as a semiconductor wafer having a patterned surface, and subsequently performing a supercritical fluid processing onto the substrate.

BACKGROUND

Generally, semiconductor device fabrication processes which form a lamination structure of an integrated circuit on surfaces of substrates such as semiconductor wafers (hereinafter, referred to as "wafers") include a cleaning process by which undesired objects such as fine dusts or natural oxide films, are removed from the surfaces of wafers by supplying a cleaning solution such as a chemical solution to the wafers.

A single-wafer type spin cleaning apparatus which is one type of substrate processing apparatuses for use in the aforementioned cleaning process employs a nozzle for spraying a solution, for example, an alkaline solution or an acid cleaning solution to the surface of the spinning wafer, to thereby remove the dusts or natural oxides from the surface of the wafer. In such a case, the residual liquid (cleaning solution) remaining on the surface of the wafer may be removed by rinsing the wafer with deionized water (DIW), and a subsequent wafer rotating stage for scattering and drying the wafer.

However, with the trends of high integration of semiconductor devices, so-called a pattern collapse is becoming a problem in the process of removing the aforementioned liquid from the surface of the wafer. The pattern collapse is, for example, a phenomenon where the convex portion of a convex-concave shape that forms the pattern is collapsed toward a side where more liquid remains when the balance of the surface tension for laterally extending the convex portion is broken. This phenomenon may happen when the liquid remaining at both-sides of the convex portion is not uniformly dried during the liquid removing stage of the wafer.

There is a known drying method that uses a liquid having a supercritical phase (supercritical fluid), as a method for removing the liquid from the surface of the wafer while suppressing the above-described pattern collapse phenomenon. The supercritical fluid has a relatively low viscosity as compared to a liquid and superior liquid dissolving capability having no liquid-gas interface. Therefore, the liquid on the wafer may be dried without being influenced by a surface tension by contacting and dissolving the liquid on the surface of the wafer with the supercritical fluid.

Japanese Patent Laid-Open No. 2008-72118 discloses a technique in which the substrate cleaned by a cleaning unit is conveyed into a drying apparatus by a substrate transport robot, and subsequently, brought into contact with the supercritical fluid in the drying apparatus to remove the cleaning solution from the surface of the substrate. See, for example, paragraphs [0029]~[0033] and [0042] along with FIGS. 1, 6, 7 of Japanese Patent Laid-Open No. 2008-72118. As the cleaning unit and the drying apparatus are arranged separately from each other in the technique disclosed in Japanese Patent Laid-Open No. 2008-72118, an operation for conveying substrates between the cleaning unit and the drying apparatus is necessary, which may sacrifice an overall throughput of the substrate processing system equipped with the cleaning unit and the drying apparatus. Moreover, in a case where the cleaning solution evaporates during the substrate conveying operation, there is a possibility that a pattern collapse may occur prior to the introduction of the substrate into the drying apparatus.

SUMMARY

According to an embodiment, there is provided a substrate processing apparatus comprising a cleaning bath which accommodates a substrate therein and cleans the substrate by a cleaning solution flowing therethrough, and a processing vessel which accommodates the cleaning bath therein and performs a supercritical fluid processing onto the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 2 is a longitudinal-sectional view of the wafer processing system.

Each of FIG. 3(a)

Each of FIG. 8(a), FIG. 8(b)

Each of FIG. 9(a), FIG. 9(b)

Each of FIG. 10(a), FIG. 10(b)

Each of FIG. 11(a)

Each of FIG. 13(a), FIG. 13(b)

Each of FIG. 14(a), FIG. 14(b)

Each of FIG. 15(a), FIG. 15(b), FIG. 15(c)

DETAILED DESCRIPTION

Figure 1:
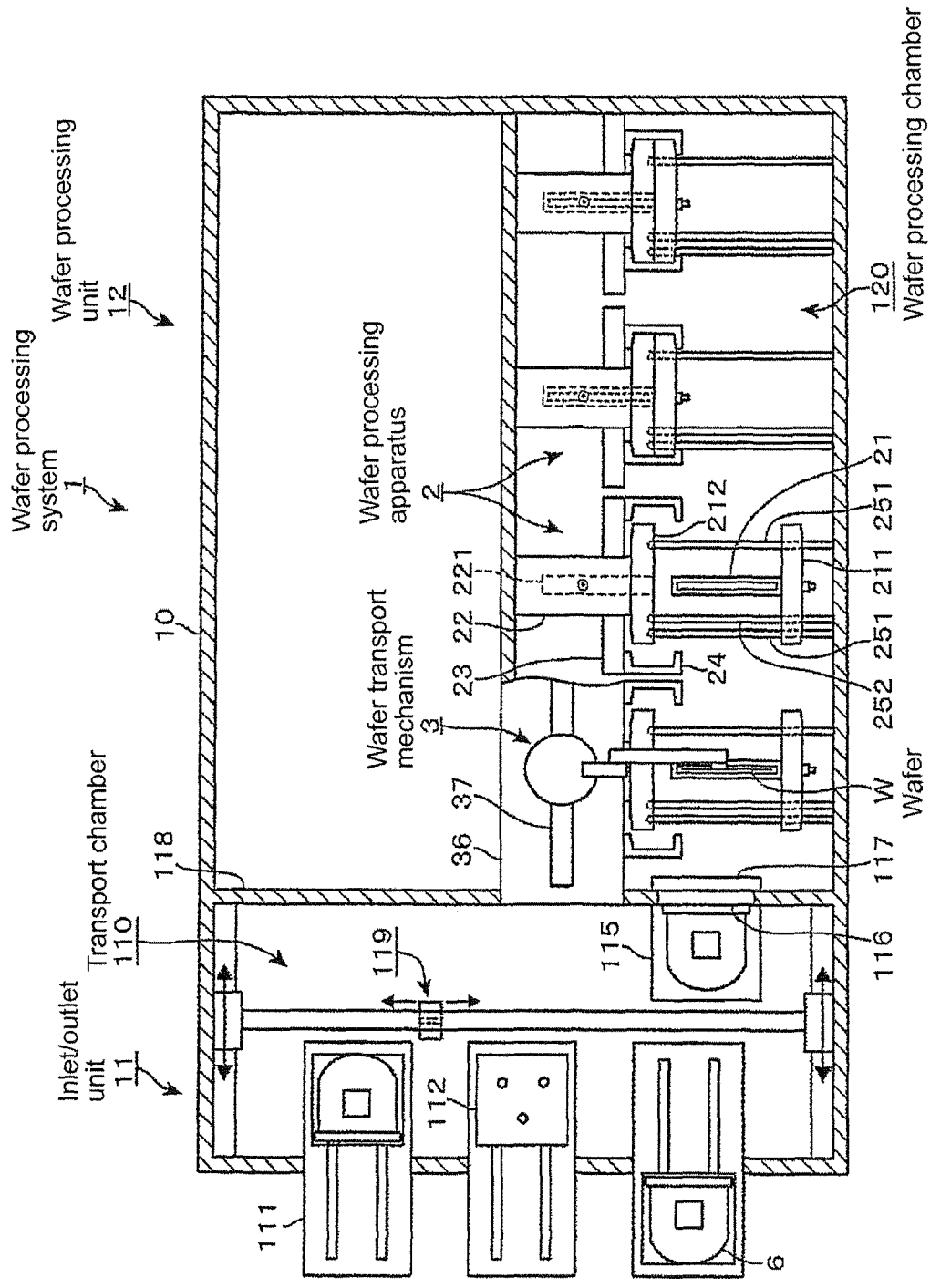
FIG. 1 is a cross-sectional view illustrating a wafer processing system equipped with a wafer processing apparatus according to an exemplary embodiment of the present invention.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provide a substrate processing apparatus and a substrate processing method that can contribute to the throughput enhancement and carry out a supercritical fluid processing without exposing the pattern formed on the substrate to an atmospheric environment.

According to an embodiment, there is provided a substrate processing apparatus that includes a cleaning bath which accommodates a substrate therein and cleans the substrate by a cleaning solution flowing therethrough, and a processing vessel which accommodates the cleaning bath therein and performs a supercritical fluid processing onto the substrate.

The substrate processing apparatus may include the following features such as (a) a fluid supply unit configured to supply a liquid for obtaining a supercritical fluid, or supply a supercritical fluid into the cleaning bath, and a fluid discharge unit configured to discharge the fluid from the cleaning bath, (b) a heating unit configured to heat the liquid for obtaining a supercritical fluid to turn the liquid into a supercritical state, or heat the supercritical fluid to maintain the supercritical fluid at a supercritical state, (c) a pressurizing unit configured to pressurize the liquid for obtaining a supercritical fluid to turn the liquid into a supercritical state, or pressurize the supercritical fluid to maintain the supercritical fluid at a supercritical state, and The substrate processing apparatus may further include the following features such as (d) a driving unit configured to move the cleaning bath and the processing vessel relatively with each other so as to select between one of states where the cleaning bath is disposed outside the processing vessel and where the cleaning bath is disposed inside the processing vessel, (e) cleaning of a substrate is performed at the state where the cleaning bath is disposed outside the processing vessel, (f) cleaning of a substrate is performed at the state where the cleaning bath is disposed inside the processing vessel, and the substrate is transferred to the cleaning bath at the state where the cleaning bath is disposed outside the processing vessel, (g) the cleaning bath is mounted with a cover part for closing the processing vessel, and the driving unit drives the cleaning bath and the processing vessel relatively with each other so that the cleaning bath is introduced into the processing vessel to close the processing vessel by the cover part, and the cleaning bath is extracted from the processing vessel to open the processing vessel, (h) the cleaning bath is disposed inside the processing vessel, and the processing vessel has an inlet/outlet port which is opened/closed by a partitioning member so that the substrate is transferred between the outside of the processing vessel and the cleaning bath via the inlet/outlet port, (i) an upper side of the cleaning bath is opened to accommodate the substrate in a vertical direction.

According to another embodiment, there is provided a substrate processing method including steps of cleaning a substrate by flowing a cleaning solution through a cleaning bath that accommodates the substrate, and processing the substrate using a supercritical fluid while the cleaning bath is contained in a processing vessel.

In particular, the substrate processing method further includes steps of cleaning the substrate at a state where the cleaning bath is disposed outside the processing vessel, and after cleaning the substrate at a state where the cleaning bath is disposed outside the processing vessel, moving the cleaning bath and the processing vessel relatively with each other to dispose the cleaning bath inside the processing vessel. Also, the substrate processing method further includes a step of cleaning the substrate at a state where the cleaning bath is disposed inside the processing vessel.

The present disclosure is advantageous in that the substrate is cleaned within the cleaning bath, and subsequently, a supercritical fluid processing is performed on the substrate within the processing vessel while the substrate is accommodated in the cleaning bath. As a result, a substrate processing using the supercritical fluid where the cleaning solution on the surface of the substrate can be dried out, may be performed without forming a liquid-gas interface on the surface of the substrate before starting the processing, and without causing a pattern collapse. Further, when compared to a case, for example, where each of the cleaning process and a supercritical liquid process is performed at a separate apparatus, the present disclosure eliminates the necessity of exchanging or conveying substrates between the apparatuses, thereby enhancing the throughput.

Hereinafter, a detailed description will be given for a wafer processing apparatus according to an exemplary embodiment of the present disclosure. The wafer processing apparatus of the present disclosure cleans the patterned surface of a wafer by using an alkaline or acid chemical solution, and dries the surface of the wafer by utilizing a supercritical state carbon dioxide ($CO_2$). FIG. 1 is a cross-sectional view illustrating a wafer processing system 1 having the wafer processing apparatus, and FIG. 2 is a longitudinal-sectional view of the wafer processing system 1. Throughout the description of the wafer processing system 1, the left side of FIG. 1 and FIG. 2 will be regarded as a front side. Wafer processing system 1 includes an inlet/outlet unit 11 for entry/exit of a FOUP (Front Opening Unified Pod) 6, and a wafer processing unit 12 for cleaning and drying a wafer W. Inlet/outlet unit 11 and wafer processing unit 12 are sequentially arranged from the front side.

Inlet/outlet unit 11 includes a rack 111 on which FOUP 6 is disposed and a transport chamber 110 into which FOUP 6 disposed on rack 111 is carried. FOUP 6 is configured to be transported into a factory by a transport robot (not shown) such as an OHT (Overhead Hoist Transport), and accommodates a plurality of wafers W. Three racks 111, for example, are installed at the front surface of a case 10 which forms an outer appearance of wafer processing system 1, and trays 112 are arranged on an upper face of respective racks 111. Trays 112 are slidable along the upper surface of inlet/outlet unit 11 in a forward and backward direction, and capable of carrying-in and carrying-out FOUP 6 to or from transport chamber 110 via an opening 113 formed at the front surface of case 10. Referring to FIG. 2, reference numeral 114 denotes a door for opening/closing opening 113 where FOUP 6 is carried-in and carried-out.

Disposed within transport chamber 110 are a wafer transfer unit 115 which transfers wafer W taken out from FOUP 6 to wafer processing unit 12 disposed in the rear end thereof, and a FOUP transport mechanism 119 which transports FOUP 6 between trays 112 slid into transport chamber 110 and wafer transfer unit 115. Wafer transfer unit 115 is constituted by trays on which FOUP 6 is disposed, and a partition wall 118 facing wafer transfer unit 115 has an opening 116 which is opened toward a wafer processing chamber 120 which will be described later. Opening 116 is equipped with a door 117 which is slidable in an upward and downward direction between the position opposed to FOUP 6 and a retreated position below opening 116, and door 117 has a function of opening/closing a cover arranged at the side surface of FOUP 6.

FOUP transport mechanism 119 holds the top flange of FOUP 6 to lift FOUP 6, as shown in FIG. 2, and freely transports FOUP 6 in a forward and backward direction, and in a left and right directions, as shown in FIG. 1.

Wafer processing unit 12 is arranged in the rear end of transport chamber 110 with partition wall 118 disposed therebetween, and wafer processing chamber 120 is arranged within wafer processing unit 12. Four wafer processing apparatuses 2, for example, for performing wafer cleaning processing and subsequent drying process, and a wafer transport mechanism 3 for transporting wafer W between FOUP 6 on wafer transfer unit 115 and each of wafer processing apparatuses 2, are arranged in wafer processing chamber 120.

As shown in FIG. 1 and FIG. 2, four wafer processing apparatuses 2 are arranged in wafer processing chamber 120 in a line along with a front and rear direction on the bottom surface of case 10. Hereinafter, throughout the description of wafer processing apparatus 2 and wafer transport mechanism 3, the right side is regarded as a front side and the left side is regarded as a rear side when viewed from the inlet/outlet unit side.

Wafer transport mechanism 3 is disposed on a support 36 which is arranged above the rear side of wafer processing apparatuses 2, and travels along a travel path 37 formed on support 36 to move above each of wafer processing apparatuses 2 to transport wafer W.

Figure 3A:
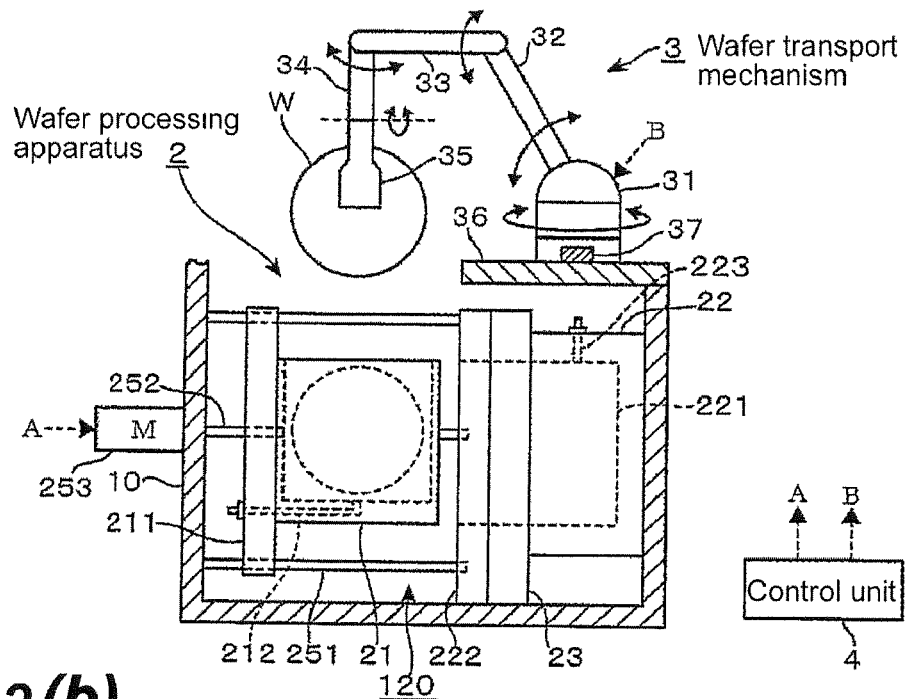
FIG. 3(b) is a longitudinal-sectional view of the wafer processing apparatus.

As shown in FIG. 3(a), wafer transport mechanism 3 includes a base 31 which is rotatable about a vertical axis. A first arm 32, a second arm 33, a third arm 34, and a pick 35 are connected in a sequence from base 31 as a rear-end.

Figure 8A:
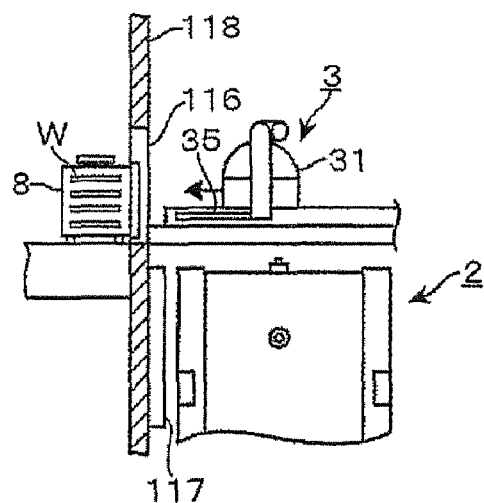
FIG. 8(c) is a first explanatory view showing the operation of the wafer processing apparatus.

First to third arms 32, 33, 34 may rotate about a horizontal axis extending in the direction parallel to support 36 or travel path 37. Further, as shown in FIG. 2, pick 35 disposed at the front-end of wafer transport mechanism 3 is formed with a flat thin film member, and has a vacuum chuck (not shown) at the front end to adsorb and hold wafer W. In addition, as shown in FIG. 3(a) and FIG. 8(a), pick 35 is capable of rotating about a horizontal axis extending in the direction straight to support 36 or travel path 37, and capable of entering FOUP 6 in a horizontal direction to carry-in or carry-out wafer W into or from FOUP 6.

Each of four wafer processing apparatuses 2 arranged in wafer processing chamber 120 has substantially similar configurations, and performs a wafer cleaning process and a supercritical drying process independently from each other without forming a liquid-gas interface on the surface of wafer W. Hereinafter, wafer processing apparatuses 2 will be described in more detail. Each of wafer processing apparatuses 2 includes a cleaning bath 21 in which wafer W is kept substantially in its upright position and cleaned, and a supercritical drying vessel 22 serving as a processing vessel in which wafer W that is cleaned in cleaning bath 21 is dried.

Figure 4:
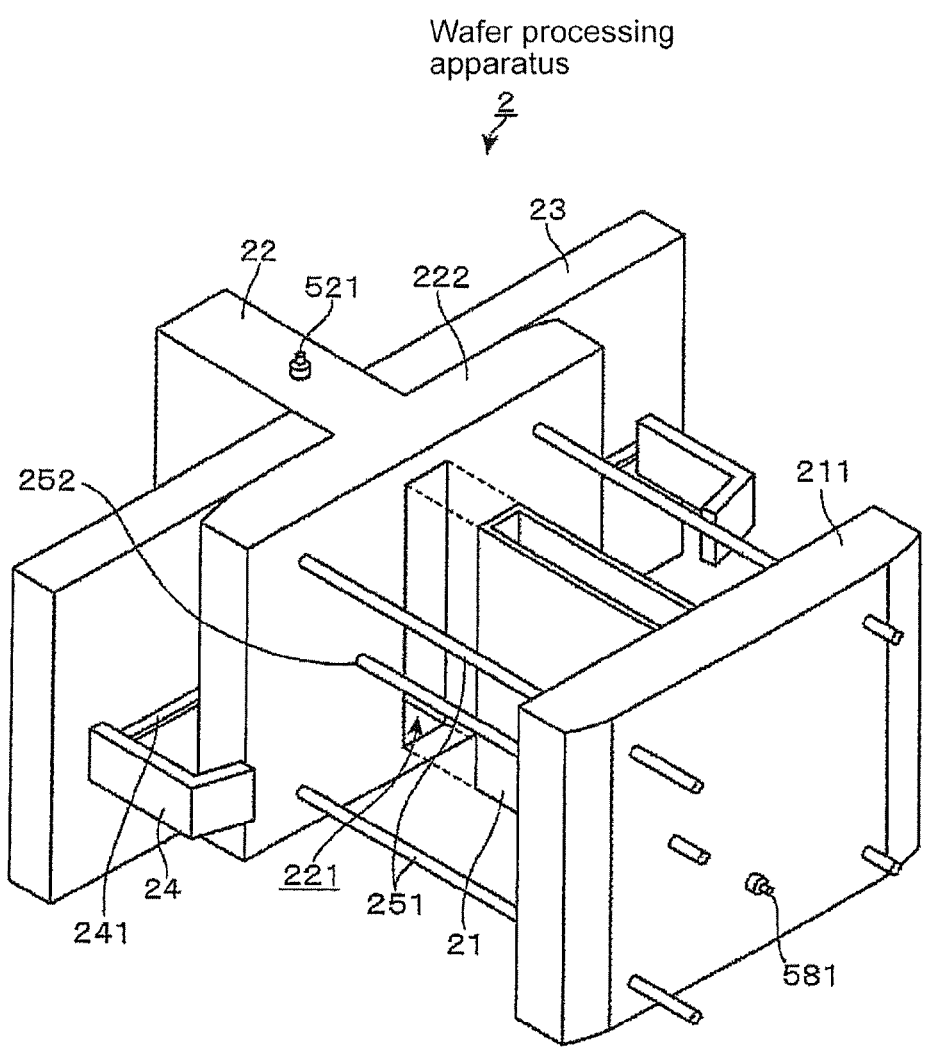
FIG. 4 is a first perspective view illustrating the outer appearance of the wafer processing apparatus.
Figure 6:
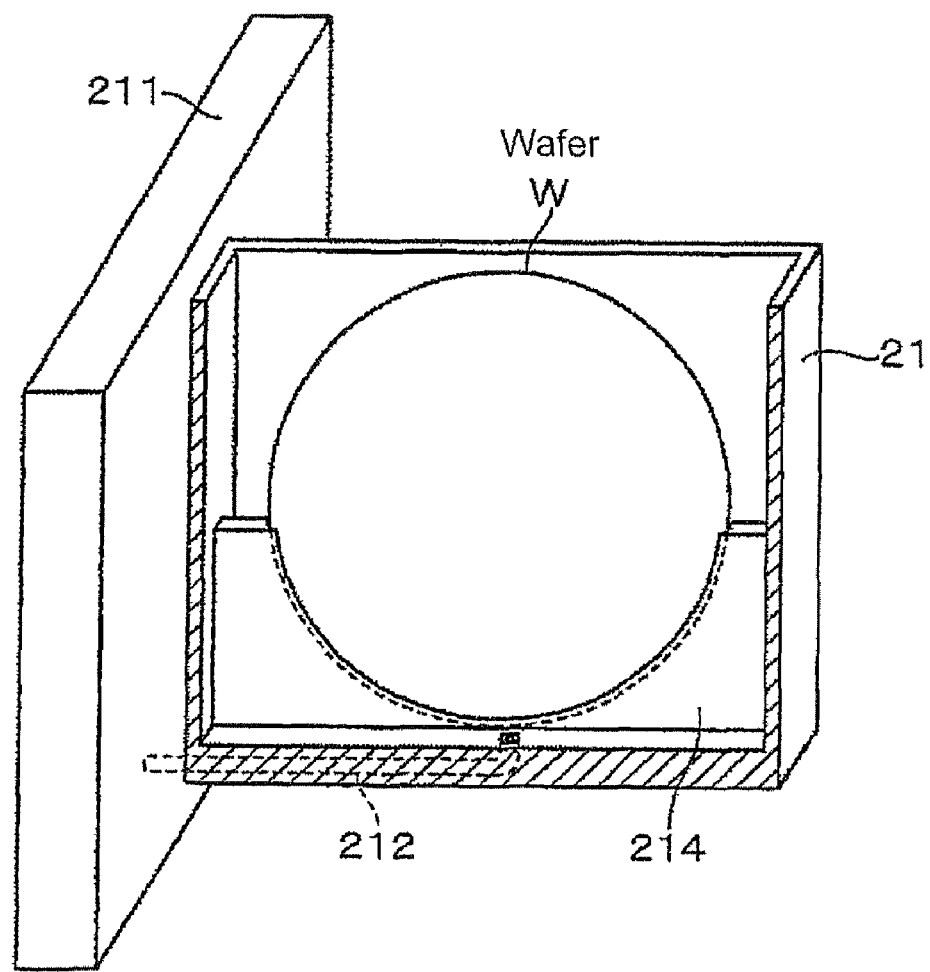
FIG. 6 is a partial sectional view illustrating the configuration of a cleaning bath in the wafer processing apparatus.

As shown in FIG. 3(a), FIG. 4, and FIG. 6, cleaning bath 21 is, for example, a case with a flat rectangular shape to accommodate one sheet of wafer W in substantially in its upright position, and has a top opened to the atmosphere of wafer processing chamber 120. When viewed from the front side of wafer processing apparatus 2, cleaning bath 21 has a lateral thickness of several tens of mm to several tens of cm, and pick 35 of wafer transport mechanism 3, which adsorbs and holds wafer W enters cleaning bath 21 via the top opening thereof to carry-in or carry-out wafer W into or from cleaning bath 21.

As shown in FIG. 6, a wafer holding portion 214 which is notched in accordance with the shape of wafer W is arranged on the inner bottom surface of cleaning bath 21. The wafer holding portion 214 has a notched groove for insertion of the lower circumference of wafer W loaded in cleaning bath 21, whereby keeping wafer W substantially in its upright position.

As shown in FIG. 1 and FIG. 4, when viewed from the front side of wafer processing apparatus 2, cleaning bath 21 has a flange 211 in its side wall of the front end side. Flange 211 is widened toward the both wings of the side wall and formed with a member having a flat rectangular shape with a thickness of several cm to several tens of cm. Flange 211 serves to ensure pressure durability when cleaning bath 21 is contained within supercritical drying vessel 22 for carrying out a supercritical drying process. That is, flange 211 functions as a cover for closing supercritical drying vessel 22. Flange 211 has a flange surface at the rear side wall in contrast to a flange 222 of supercritical drying vessel 22, which will be described later, to keep the inside of supercritical drying vessel 22 airtight.

As shown in FIG. 6, an internal flow channel 212 is formed at both the inner bottom surface of cleaning bath 21 and a lower position of the center of flange 211 such that one end of internal flow channel 212 is opened to the inner bottom surface of cleaning bath 21 and the other end of internal flow channel 212 is connected to a first flow channel 581, which will be described later.

As shown in FIG. 1, for example, cleaning bath 21 is disposed within wafer processing chamber 120 in such a manner that the lengthwise direction of the opening thereof corresponds to the front and rear direction of wafer processing apparatus 2, and flange 211 becomes the front side thereof.

As shown in FIG. 3(a) and FIG. 4, supercritical drying vessel 22 is constituted with a flat rectangular shape vessel equipped with a storage space 221 capable of storing the entire cleaning bath 21, and has a thickness of several cm to several tens of cm to ensure pressure durability. Storage space 221 of supercritical drying vessel 22 has an opening formed at one of the side walls of the narrower side of supercritical drying vessel 22. Supercritical drying vessel 22 is supported by a laterally widened flat type support member 23 which is fitted to left and right side walls thereof, and fixed on the bottom surface of processing chamber 120 such that the opening of storage space 221 is directed toward cleaning bath 21.

The foremost surface of supercritical drying vessel 22, which is closer to front side than the side walls thereof supported by support member 23, has flange 222 laterally widened from the opening of storage space 221. Similar to flange 211 of cleaning bath 21, flange 222 has a flat rectangular shape member with a thickness of several cm to several tens of cm, and a flange surface is formed at the opening of supercritical drying vessel 22.

Figure 7:
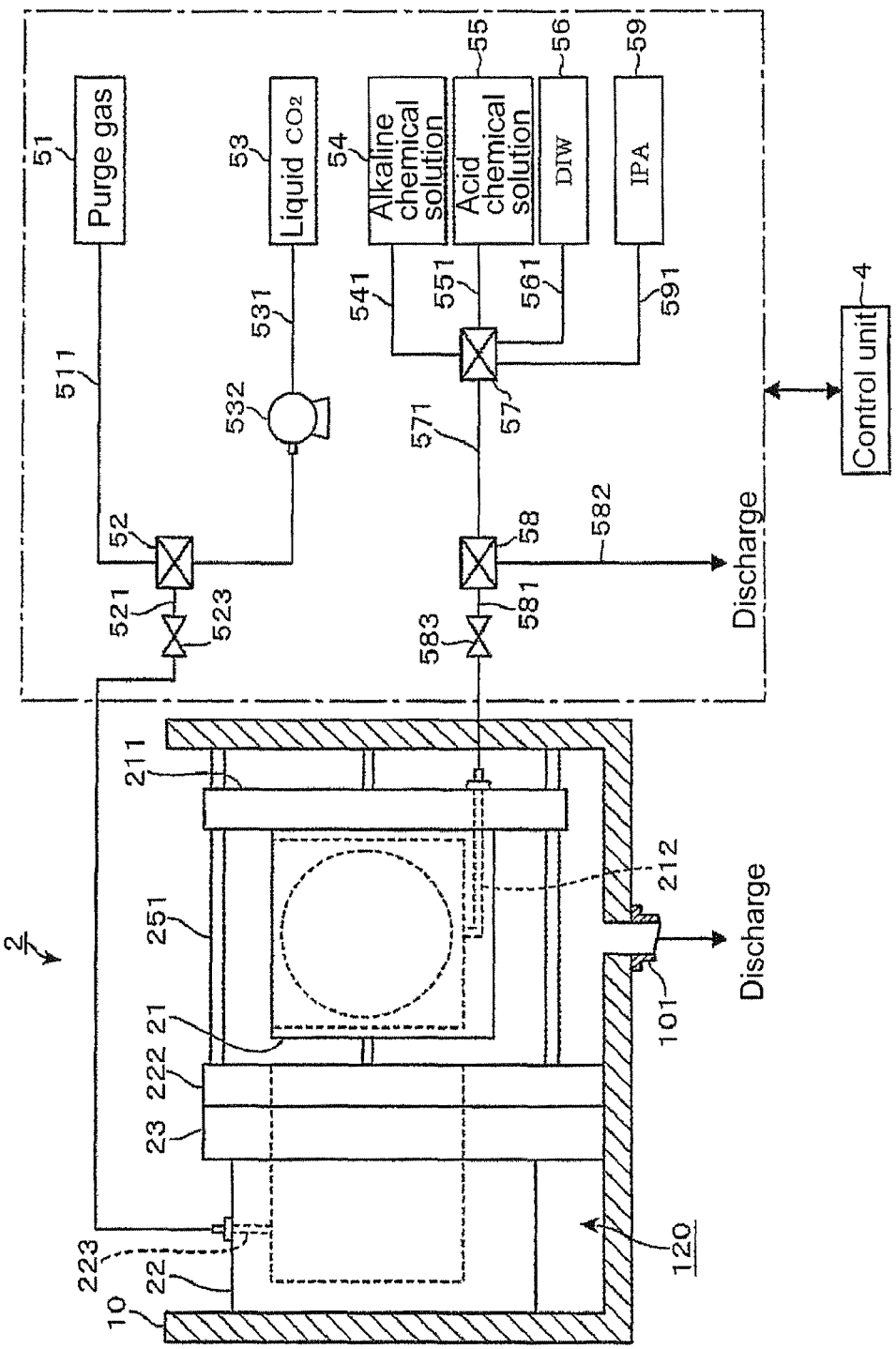
FIG. 7 is an explanatory view of the cleaning solution supply and discharge system of the wafer processing apparatus.

Further, as shown in FIG. 3(a) and FIG. 7, supercritical drying vessel 22 has a ceiling through which an internal flow channel 223 is penetrated in a vertical direction. Internal flow channel 223 has a bottom portion opened into supercritical drying vessel 22, and a top portion connected to a second flow channel 521 which will be described later.

Figure 3B:
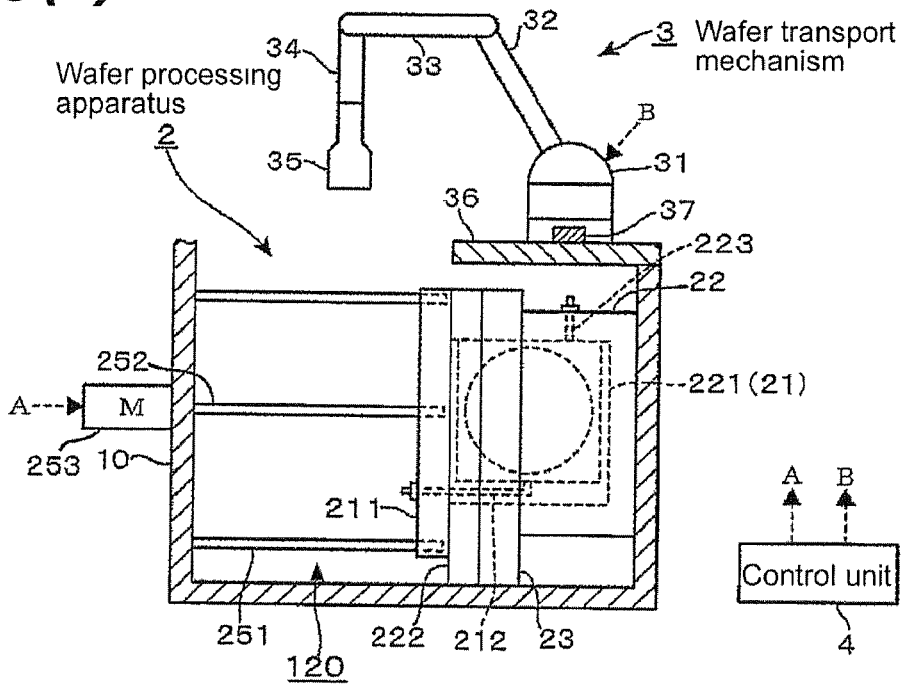
Figure 5:
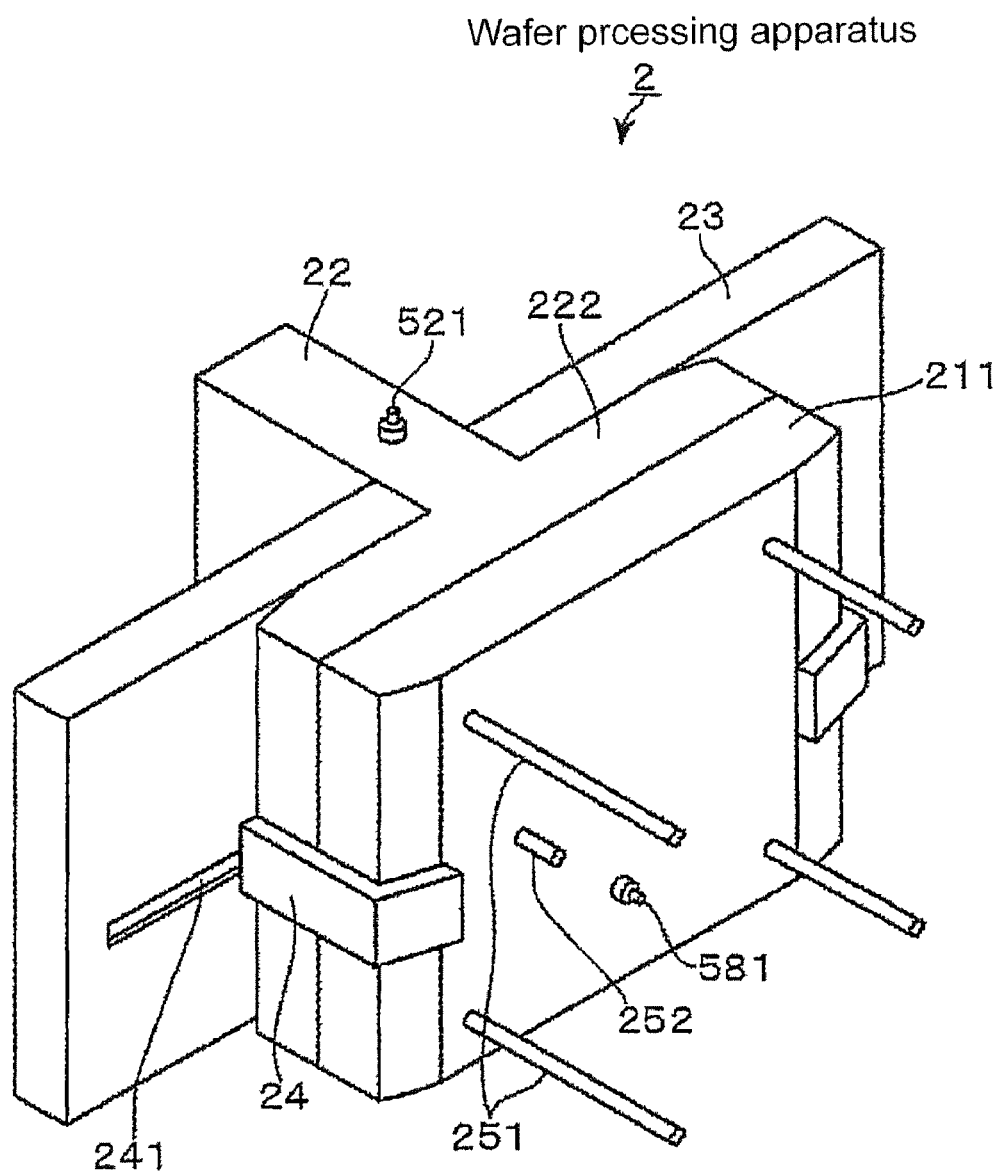
FIG. 5 is a second perspective view illustrating the outer appearance of the wafer processing apparatus.

Referring to cleaning bath 21 and supercritical drying vessel 22 having the above-described configuration, cleaning bath 21 is movable in a forward and backward direction as well as in a horizontal direction between a cleaning process position where the entire cleaning bath 21 is extracted to the front of supercritical drying vessel 22 to open supercritical drying vessel 22, as shown in FIG. 3(a) and FIG. 4, and a drying process position where the entire cleaning bath 21 is stored in supercritical drying vessel 22 to close supercritical drying vessel 22, as shown in FIG. 3(b) and FIG. 5.

A ball screw 252 is penetrated, in a forward and backward direction, through flange 211 arranged at the front surface of cleaning bath 21 to allow cleaning bath 21 to slide in a horizontal direction. Further, four guide members 251 are penetrated into flange 211 at four respective corners, when viewed from the front side of flange 211, in the same direction as that of the above-mentioned ball screw 252 for guiding the sliding direction of cleaning bath 21. The entire cleaning bath 21 and flange 211 are supported and float from the bottom surface of wafer processing chamber 120 by ball screw 252 and guide members 251. For example, as shown in FIG. 3(a), one end of ball screw 252 and guide members 251 are supported at the side wall of case 10 of wafer processing chamber 120 (case 10 also serves as a case of wafer processing system 1), and the other end of ball screw 252 and guide members 251 are supported at flange 222 of supercritical drying vessel 22.

Ball screw 252 supported at the side wall of case 10, penetrates through the side wall, and is connected to a motor 253 arranged on the outer surface of the side wall, as shown FIG. 3(a) and FIG. 3(b). Moreover, the ball screw 252 and the through hole for penetration of ball screw 252 are tapped with respective male and female screws, which are not shown, and the ball screw 252, flange 211, and motor 253 constitute a ball screw mechanism.

Cleaning bath 21 may slide in a forward and backward direction and move between the above-described cleaning process position and the drying process position by rotating ball screw 252 with synchronizing the rotating direction and rotation volume. The aforementioned ball screw mechanism corresponds to the driving unit of cleaning bath 21 and flange 211 of the present embodiment. Here, the driving unit for driving cleaning bath 21 and flange 211 is not limited to the configuration constituted by a ball screw mechanism, as described above. For example, a linear motor can be employed in place of the ball screw mechanism to move cleaning bath 21 and flange 211, or a flexible arm or an air cylinder may be employed. Motor 253 is shown only in FIG. 3(a) and FIG. 3(b) for convenience.

Reference numeral 24 of FIG. 4 and FIG. 5 denotes pressing members for pressing storage spaces 221, 222 against each other to tighten the surfaces of flanges 211, 222. Pressing members 24 travel laterally along a travel path 241 to slide between the position where pressing members 24 press storage spaces 221, 222 after cleaning bath 21 has slid into the drying process position and the position where pressing members 24 retreat in left and right directions, respectively, to open storage spaces 221, 222 when cleaning bath 21 moves into the cleaning process position.

Now, the configuration of the system for supplying a cleaning solution to cleaning bath 21 and $CO_2$ used for supercritical drying process to supercritical drying vessel 22 will be explained. As shown in FIG. 7, internal flow channel 212 formed from the inner bottom surface of cleaning bath 21 through flange 211 is connected to first flow channel 581, and first flow channel 581 is connected to a switch valve 58 via an open/close valve 583 having a pressure durability. The part that first flow channel 581 is disposed within wafer processing chamber 120 is constituted by a flexible hose having a pressure durability, for example, and transformable in accordance with the movement of cleaning bath 21.

Switch valve 58 has a function of switching first flow channel 581 between a cleaning solution supply line 571 and a discharge line 582. Cleaning solution supply line 571 is further branched into four flow channels via switch valve 57, and an alkaline chemical solution supply line 541 connected to an alkaline chemical solution supply unit 54 supplies SC1 solution (mixture of ammonia and hydrogen peroxide) to cleaning bath 21 for removing particles or organic contaminants from surfaces of wafers W. An acid chemical solution supply line 551 connected to an acid chemical solution supply unit 55 supplies diluted hydrofluoric acid (hereinafter, DHF (Diluted Hydro Fluoric acid)) to cleaning bath 21 for removing natural oxide films from surfaces of wafers W.

Further, a DIW supply line 561 connected to a DIW supply unit 56 supplies deionized water (DIW) (or a rise solution) to cleaning bath 21 for rinsing wafers W for which processes using a variety of chemical solutions are finished. An IPA supply line 591 connected to an IPA supply unit 59 has a function of supplying isopropyl alcohol (IPA) to cleaning bath 21 such that rinsed wafers W immersed in IPA can be introduced into supercritical drying vessel 22.

Wafer processing apparatus 2 according to the exemplary embodiment of the present disclosure uses $CO_2$ as a supercritical fluid. However, if a supercritical state $CO_2$ is supplied to deionized water where wafers W are immersed after a rinse process, carbon acid can be generated, which may affect wafers W. For this reason, wafer processing apparatus 2 according to the exemplary embodiment of the present disclosure substitutes isopropyl alcohol for the liquid in cleaning bath 21 after finishing the rinse process, thereby suppressing generation of carbon acid during a supercritical drying process. Further, discharge line 582 connected to switch valve 58 serves to discharge a fluid from cleaning bath 21 to the outside of wafer processing apparatus 2.

Internal flow channel 223 which is penetrated through the ceiling of supercritical drying vessel 22 is connected to second flow channel 521 having a flexible hose with a pressure durability, and second flow channel 521 is connected to switch valve 52 via an open/close valve 523 having a pressure durability. Switch valve 52 has a function of switching second flow channel 521 between a purge gas supply line 511 and a $CO_2$ supply line 531, Purge gas supply unit 51 connected to purge gas supply line 511 supplies purge gas for discharging the atmosphere of cleaning bath 21. Further, $CO_2$ supply line 531 is connected to $CO_2$ supply unit 53 via a boost pump 532 which boosts $CO_2$ to the level of, for example, 10 MPa and supplies the supercritical state $CO_2$ to cleaning bath 21. $CO_2$ supply unit 53 or $CO_2$ supply line 531 constitutes a fluid supply unit of wafer processing apparatus 2 according to the exemplary embodiment of the present disclosure. Boost pump 532 also serves as a pressurizing unit for pressurizing $CO_2$ supplied from $CO_2$ supply unit 53 to a supercritical state as well as the inside of cleaning bath 21 so as to maintain the supercritical state.

Further, a discharge line 101 is connected to the bottom surface of case 10 of wafer processing chamber 120 (i.e., case 10 of wafer processing system 1) to discharge a liquid from the bottom surface of wafer processing chamber 120. The above-enumerated gas or liquid supply units 51, 53, 54, 55, 56, supply lines 511, 531, 541, 551, 561 are disposed in the rear region of wafer processing apparatus 2 (that is, left region viewed from inlet/outlet unit 11 of wafer processing system 1)

As shown in FIG. 2, FIG. 3(a), FIG. 3(b), and FIG. 7, wafer processing system 1 containing wafer processing apparatus having the above-described configuration, is connected to a control unit 4. Control unit 4 is constituted, for example, by a computer having a CPU and a memory unit, which are not shown, and the memory unit stores a program containing processes (commands) for control of the operation of wafer processing system 1, wafer transport mechanism 3, or wafer processing apparatus 2, such as operation for extracting wafers W from FOUP 6 loaded in inlet/outlet unit 11, transporting wafers into each of wafer processing apparatuses 2, performing cleaning and supercritical drying processes, and removing wafers W. The above-described program may be stored in a memory medium such as a hard disk, a compact disk, a magnet optical disk, a memory card, and installed in the computer therefrom. Control unit 4 may be arranged in the rear portion of wafer processing apparatus 2.

Thus-configured wafer processing system 1 operates as follows. When FOUP 6 is disposed on one of inlet/outlet units 11, tray 112 slides to load FOUP 6 into transport chamber 110. The top flange of FOUP 6 loaded in transport chamber 110 is held and lifted by FOUP transport mechanism 119 and transport to wafer transfer unit 115 in transport chamber 110.

When FOUP 6 is disposed on wafer transfer unit 115, open/close door 117 removes the cover from FOUP 6 and retreat toward the lower direction. As shown in FIG. 8(a), wafer transport mechanism 3 rotates pick 35 such that pick 35 is kept in a nearly horizontal direction to allow the wafer adsorption surface thereof to be directed upwardly, moves base unit 31 toward transport chamber 110, and introduces pick 35 into FOUP 6 such that pick 35 is located beneath the target wafer W.

Subsequently, pick 35 is lifted to transfer wafer W from FOUP 6 to wafer transport mechanism 3, and base unit 31 is moved in the direction opposite to transport chamber 110 to move pick 35 away from FOUP 6. When the target wafer W is thus-extracted, base unit 31 is moved toward wafer processing apparatus 2 where a wafer cleaning process is carried out.

Figure 8B:
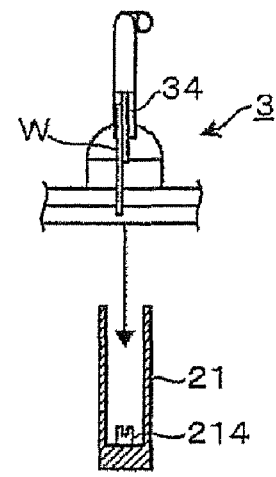

As shown in FIG. 3(a), wafer processing apparatus 2 keeps cleaning bath 21 which has an empty interior and is extracted from supercritical drying vessel 22 at the cleaning process position, and when wafer W is transferred to an upper position of cleaning bath 2, wafer transport mechanism 3 rotates pick 35 to maintain wafer W substantially in its upright position, as shown in FIG. 3(a) and FIG. 8(b), and moves the lower end of wafer W to face the opening of cleaning bath 21.

Figure 8C:
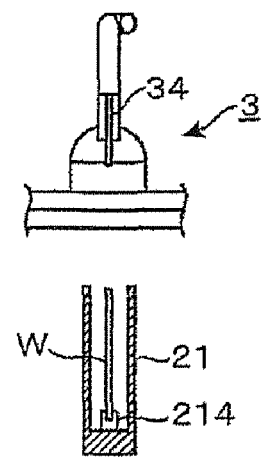

When wafer W is ready to be loaded into cleaning bath 21, each of arms 32 through 34 operates to carry pick 35 and wafer W into cleaning bath 21. When the lower circumference of wafer W is fitted into the groove formed along the inner circumference of the notch of wafer holding portion 214, pick 35 release wafer W and is retreated from cleaning bath 21, as shown in FIG. 8(c).

Figure 9A:
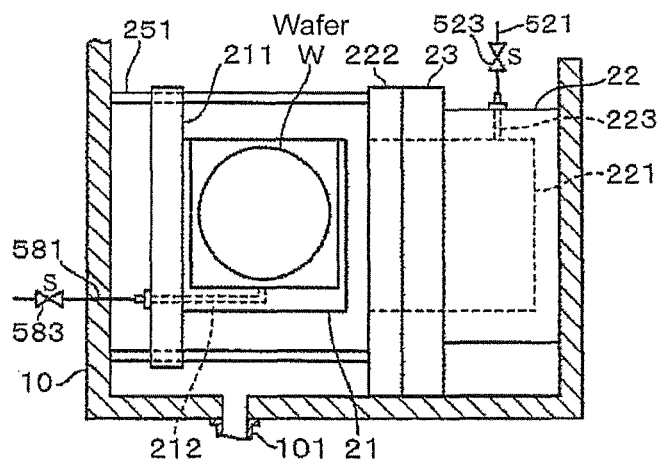
FIG. 9(c) is a second explanatory view showing the operation of the wafer processing apparatus.
Figure 9B:
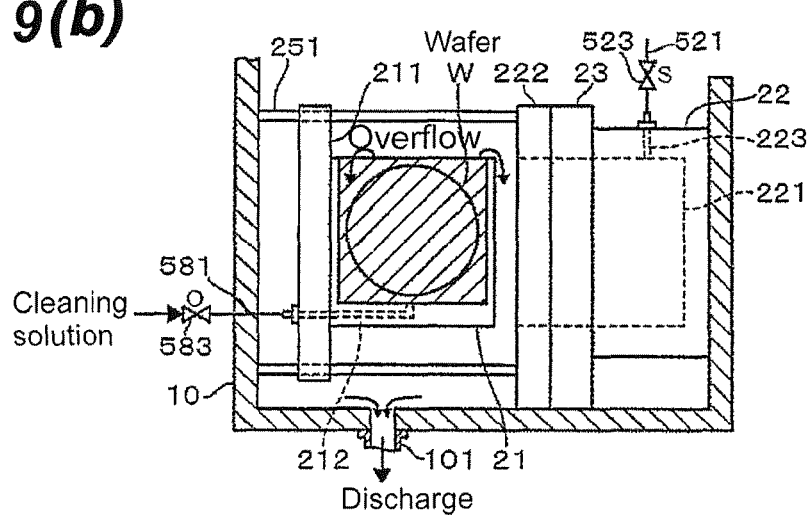

As a result of a series of operations in wafer processing apparatus 2 described above, wafer W is kept in a vertical direction within cleaning bath 21 which has moved to the cleaning process position, as shown in FIG. 9(a) which is a vertical cross section view of cleaning bath 21. When wafer W is loaded in cleaning bath 21, wafer processing apparatus 2 opens (as marked "o" in FIG. 9(b)) open/close valve 583 to allow alkaline chemical solution (SC1 solution) to be supplied from alkaline chemical solution supply unit 54. Further, in FIG. 9 and FIG. 10, some of the elements such as wafer transport mechanism 3, ball screw 252, wafer holding portion 214 in cleaning bath 21 are not shown for brevity.

The alkaline chemical solution supplied from alkaline chemical solution supply unit 54 is introduced into the space where wafer W is maintained from the bottom surface of cleaning bath 21 via internal flow channel 212, and the level of the chemical solution gradually rises, and finally, the alkaline chemical solution flows over from the opening formed at the top of cleaning bath 21. As described above, alkaline chemical solution is supplied from the bottom surface of cleaning bath 21 and discharged by the overflow from the opening of cleaning bath 21, to thereby form an upstream flow of alkaline chemical solution flowing from the bottom to the top within cleaning bath 21. As a result, when the surfaces of wafers W are brought into contact with the upstream flow, the removal of particles or organic contaminants is promoted. In the above-described process, the opening of cleaning bath 21 serves as a liquid discharge for discharging the cleaning solution from cleaning bath 21.

The alkaline chemical solution overflowed from cleaning bath 21 is discharged to the outside from discharge line 101 formed at the bottom surface of case 10 of wafer processing chamber 120. The hatched diagonal stripes in FIG. 9(b), which is a vertical cross-sectional view of cleaning bath 21, illustrates that cleaning bath 21 is filled with a cleaning solution such as an alkaline or acid chemical solution.

When the wafer cleaning process using an alkaline chemical solution is thus-finished, the cleaning solution supplied to cleaning bath 21 is replaced with DIW supplied from DIW supply unit 56 thereby filling the inside of cleaning bath 21 with DIW, and the surface of wafer W is rinsed. The rinse process being performed on the surface of wafer W is also stimulated by the upstream of DIW in cleaning bath 21. Moreover, as the cleaning solution replacement is performed at the state where the inside of cleaning bath 21 is filled with a liquid, the surface of wafer W is not exposed to a gas, and pattern collapse at the liquid-gas interface is prohibited. Further, as wafer processing apparatus 2 according to the exemplary embodiment of the present disclosure performs the cleaning solution replacement by replacing the liquid in cleaning bath 21, the volume of the space in cleaning bath 21 may be minimized as much as possible to enable a quick replacement of the cleaning solution.

After performing the rinse for a predetermined time, the cleaning solution being supplied to cleaning bath 21 is replaced with an acid chemical solution (DHF) to remove a natural oxide film from the surface of wafer W. The process for supplying the alkaline chemical solution is similar to the process for supplying the acid solution in that the acid chemical solution overflows from the opening of cleaning bath 21, an upstream flow is formed in cleaning bath 21, and the replacement to acid chemical solution is performed at the state where cleaning bath 21 is filled with DIW.

After the cleaning process using the acid chemical solution is performed for a predetermined time, the cleaning solution supplied to cleaning bath 21 is replaced with DIW to perform a wafer rinse process. Subsequently, the supply of DIW is stopped and the inside of cleaning bath 21 is filled with IPA thereby completing a series of cleaning process. (the open/close valve of first flow channel 581 is closed (S)) In wafer processing apparatus 2 according to the exemplary embodiment of the present disclosure, the wafer cleaning process is performed outside of supercritical drying vessel 22 where the final supercritical drying process is performed, thereby preventing supercritical drying vessel 22 from being contaminated by a variety of cleaning solutions that contains particles or dirt. Upon completing the wafer cleaning process, the inside of cleaning bath 21 is filled with IPA, and wafer W is immersed in IPA.

Figure 9C:
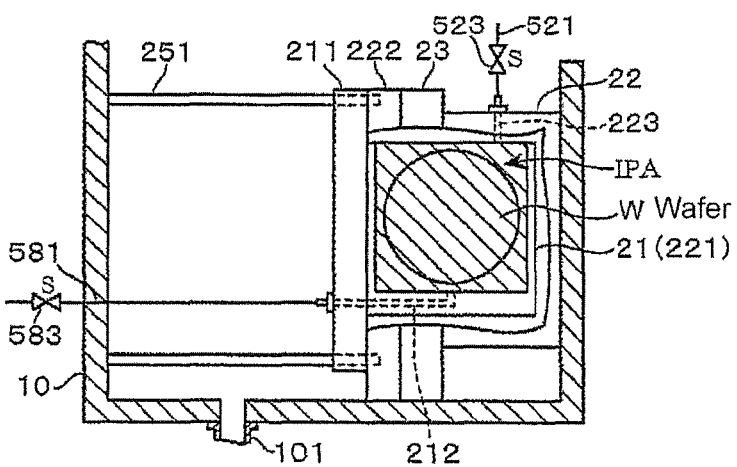

When the wafer cleaning process is thus-completed, cleaning bath 21 slides and enters into storage space 221 of supercritical drying vessel 22, and surfaces of flanges 211, 222 are tightened to close supercritical drying vessel 22 and keep the vessel airtight, as shown in FIG. 9(c). Here, an air knife and the like may be arranged in front of the opening of storage space 221 to remove the cleaning solution attached to the outer wall of cleaning bath 21 during an overflow, before cleaning bath 21 is introduced into storage space 221. The hatched diagonal stripes in FIG. 9(c) which shows a vertical cross-sectional view of cleaning bath 21, illustrates that cleaning bath 21 is filled with IPA.

When supercritical drying vessel 22 is kept airtight, open/close valve 523 of second flow channel 521 connected to internal flow channel 223 formed at the ceiling of supercritical drying vessel 22 is opened (O), and switch valve 52 is switched to $CO_2$ supply line 531 to supply supercritical state $CO_2$ from $CO_2$ supply unit 53 into cleaning bath 21. Also, open/close valve 583 of first flow channel 521 is opened (O) to discharge the liquid from the inside of cleaning bath 21. Here, switch valve 58 at the downstream of first flow channel 581 is switched to discharge line 582, and IPA in cleaning bath 21 is extracted by the force of the supercritical state $CO_2$ supplied from the upper portion of cleaning bath 21. As a consequence, IPA is discharged to discharge line 582 via internal flow channel 212 arranged on the bottom surface of cleaning bath 21, and discharged to the outside. In this operation, first flow channel 581 and discharge line 582 constitute a liquid discharge unit for discharging IPA from the inside of cleaning bath 21.

Figure 10A:
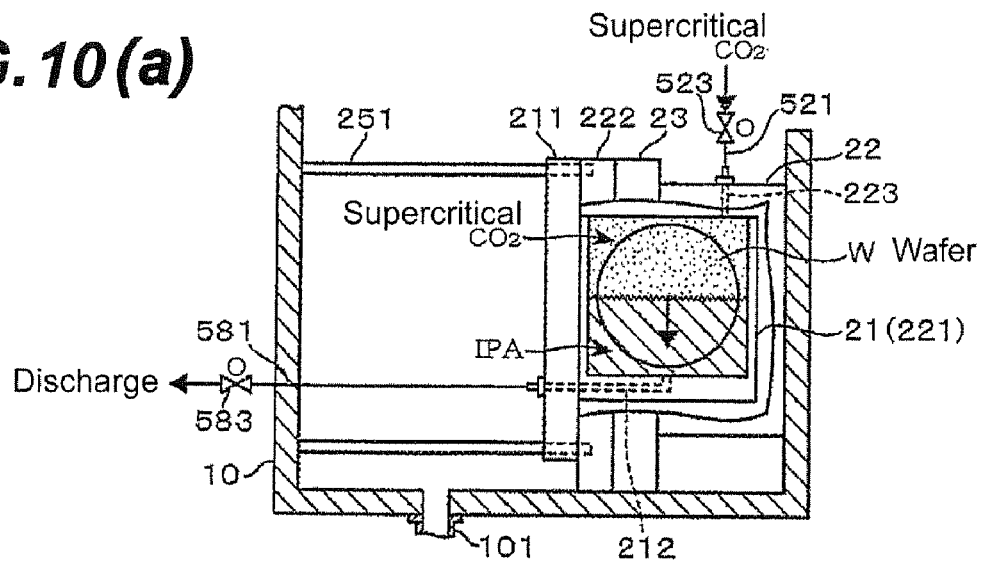
FIG. 10(c) is a third explanatory view showing the operation of the wafer processing apparatus.

By these operations, as shown in FIG. 10(a), two images are formed in cleaning bath 21 including an IPA image (i.e., the region with diagonal stripes) formed in the lower portion of cleaning bath 21, and a supercritical $CO_2$ image (i.e., the region with a dotted pattern) formed in the upper portion of cleaning bath 21. As supercritical $CO_2$ is supplied and IPA is discharged, the interface between the two images gradually moves downward and the surface of wafer W is applied with supercritical $CO_2$ instead of IPA, thereby removing a liquid from the surface of wafer W. Here, open/close valve 583 may have a function of a throttle valve, and thus, the degree of opening for extracting IPA may be adjusted to keep the pressure in cleaning bath 21 at the level that can maintain the supercritical state of $CO_2$.

Figure 10B:
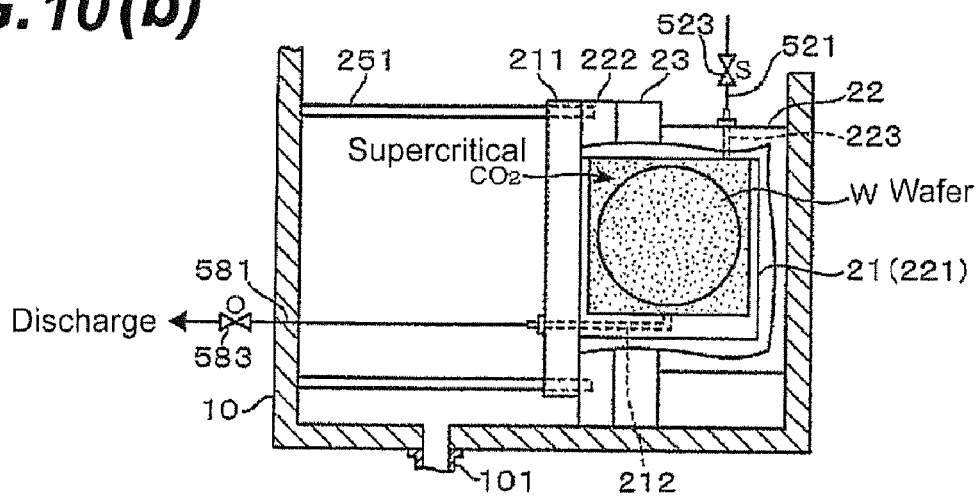
Figure 10C:
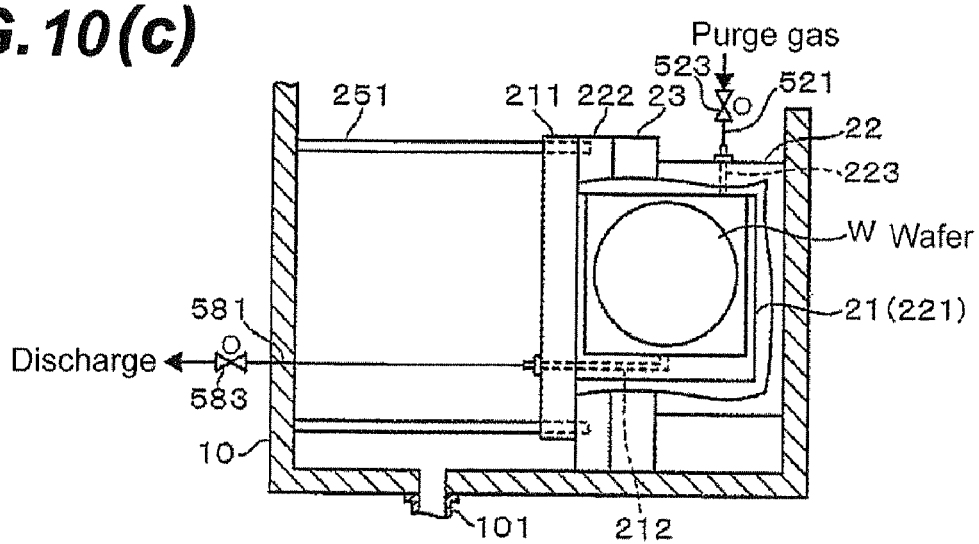

As shown in FIG. 10(b), when the substitution into supercritical $CO_2$ in cleaning bath 21 is completed, open/close valve 523 of second flow channel 521 is closed (S) to stop the supply of supercritical $CO_2$, and $CO_2$ is started to be discharged from first flow channel 581. When $CO_2$ is discharged, pressure in cleaning bath 21 is gradually decreased, and finally, $CO_2$ is turned to a gas state and discharged. Here, as shown in FIG. 10(c), switch valve 52 of second flow channel 521 may be switched to purge gas supply line 511 to supply purge gas into cleaning bath 21 to stimulate discharge of $CO_2$ from cleaning bath 21. In this operation, first discharge line 583 serves as a supercritical fluid discharge unit for discharging a supercritical fluid from cleaning bath 21 including the $CO_2$ gas discharge due to the decreased pressure. Here, cleaning bath 21 or supercritical drying vessel 22 may have a heater (not shown) to prevent dew condensation caused by the temperature drop resulted from the adiabatic expansion of $CO_2$, and $CO_2$ discharge may be performed such that the inside of cleaning bath 21 is maintained at the temperature level higher than a predetermined temperature.

As described above, in wafer processing apparatus 2 according to the exemplary embodiment of the present disclosure, the inside of cleaning bath 21 where wafer W is immersed in the liquid (IPA) is replaced with a supercritical fluid (supercritical state $CO_2$), and the supercritical fluid is turned into a gas by reducing the pressure of the fluid. Thus, the surface of wafer W is treated with a sequence of a liquid, a supercritical fluid, and a gas. As a result, the surface of wafer W is dried with no liquid-gas interface formed thereon.

Upon completion of supercritical drying process, cleaning bath 21 is slid to the liquid processing position, and wafer transport mechanism 3 extracts and carries wafer W into FOUP 6. When the cleaning process and supercritical drying process for an entire wafers W in FOUP 6 are completed using four wafer processing apparatuses 2, FOUP 6 is carried to inlet/outlet unit 11 along a reverse path to the FOUP carrying-in process, thereby completing a series of processes.

Wafer processing apparatus 2 according to the exemplary embodiment of the present disclosure has advantages in that wafer W is cleaned in cleaning bath 21, and supercritical $CO_2$ is supplied into cleaning bath 21 to dry wafer W while wafer W is accommodated within cleaning bath 21. As a result, there is no gas-liquid interface formed on the surface of wafer W until wafer W is dried, and the wafer cleaning process and supercritical drying process can be performed without the pattern collapse. Furthermore, as compared with the case where a cleaning process and a supercritical drying process are carried out in separate apparatuses, wafer processing apparatus 2 of the present disclosure eliminates the necessity of wafer transfer or wafer transport, thereby enhancing the throughput.

Figure 11A:
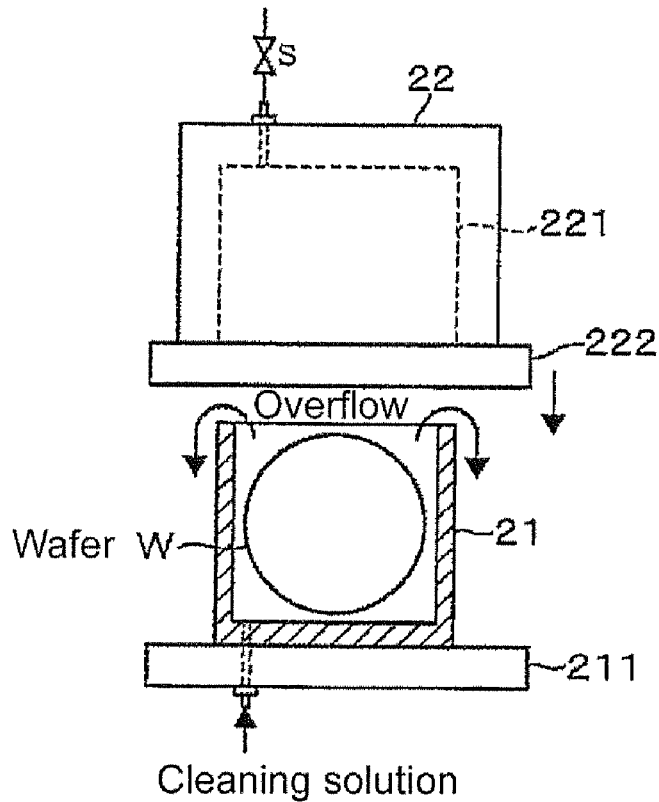
FIG. 11(b) is an explanatory view illustrating an example of the wafer processing apparatus in which a supercritical drying vessel and a cleaning bath move in a vertical direction.
Figure 11B:
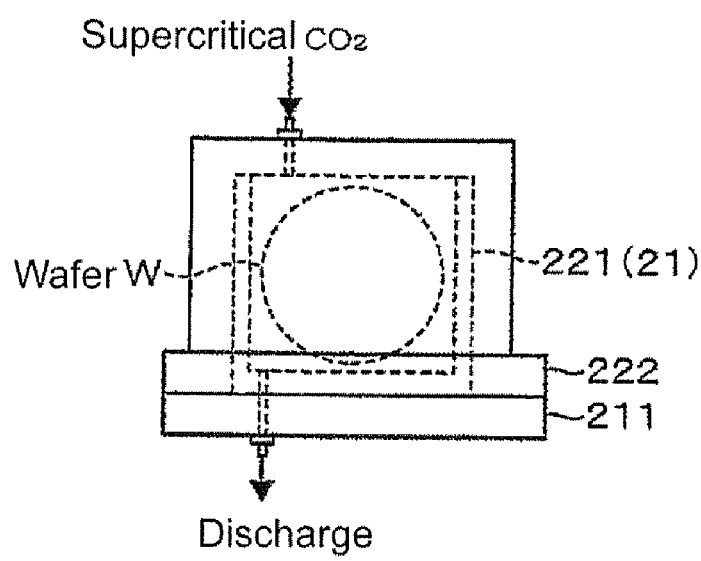

In the above-described exemplary embodiment, cleaning bath 21 is slid between the cleaning process position and the supercritical drying position, as shown in FIG. 3(a) and FIG. 3(b). However, instead of cleaning bath 21, supercritical drying vessel 22 may be moved, and the movement direction thereof may not be limited in the horizontal direction. As shown in FIG. 11(a) and FIG. 11(b), for example, for movement between the cleaning process position and the supercritical process position, flange 211 may be arranged on the bottom surface of cleaning bath 21, and cleaning bath 21 and supercritical drying vessel 22 may move relatively with each other with the opening of storage space 221 of supercritical drying vessel 22 directed downwardly.

Figure 12:
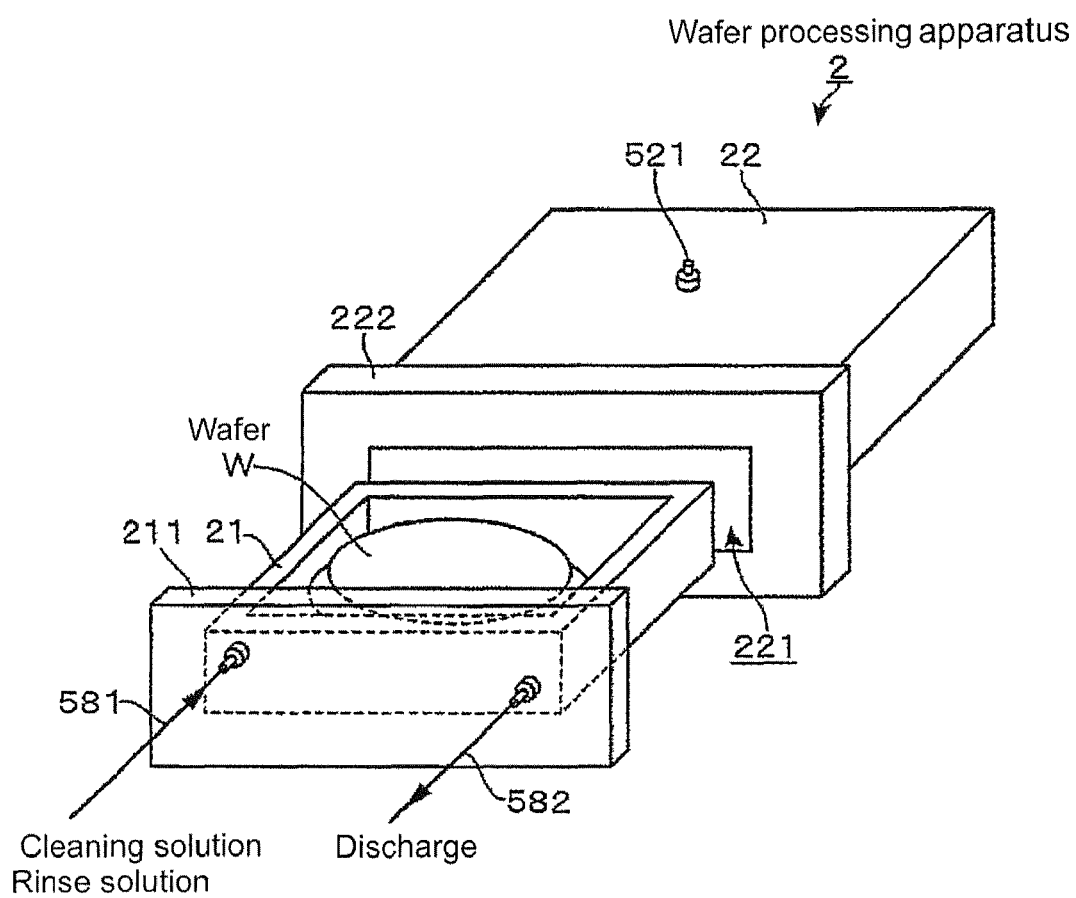
FIG. 12 is an explanatory view illustrating an example of the wafer processing apparatus in which a wafer is horizontally accommodated in the cleaning bath.

In addition, the wafer arrangement direction may not be limited to the vertical direction during the cleaning process and supercritical drying process, and wafer processing apparatus 2 may be configured such that processes are performed with wafer W disposed in a horizontal direction, as shown in FIG. 12. In the exemplary embodiment as shown in FIG. 12, the cleaning solution may be discharged via discharge line 582, instead of a set up where discharge line 582 (fluid discharge unit) is directly connected to cleaning bath 21 for an exclusive discharge of a cleaning solution and the cleaning solution overflows from the opening of cleaning bath 21. By adopting such a configuration, wafer cleaning process can be performed with cleaning bath 21 accommodated inside supercritical drying vessel 22.

Figure 13A:
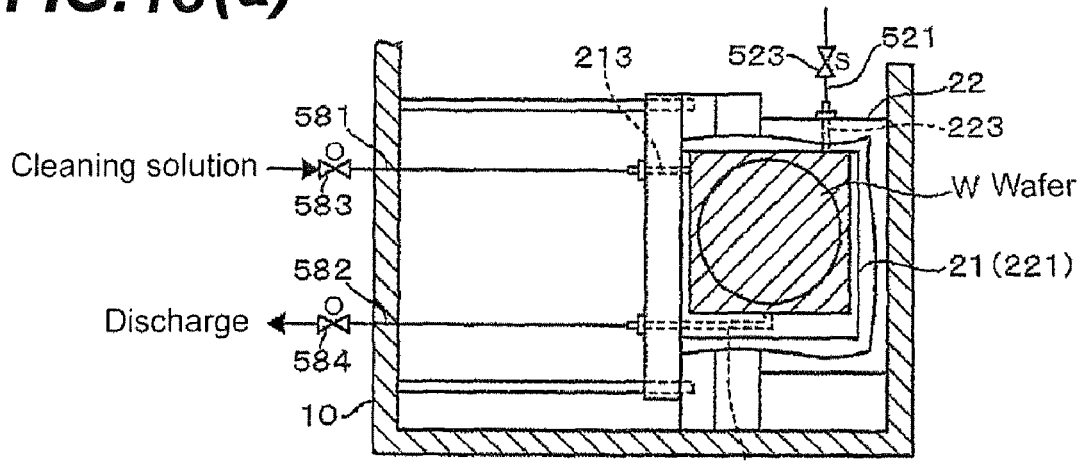
FIG. 13(c) is an explanatory view illustrating an example of the wafer processing apparatus in which a cleaning process is performed with the cleaning bath accommodated in the supercritical drying vessel.
Figure 13B:
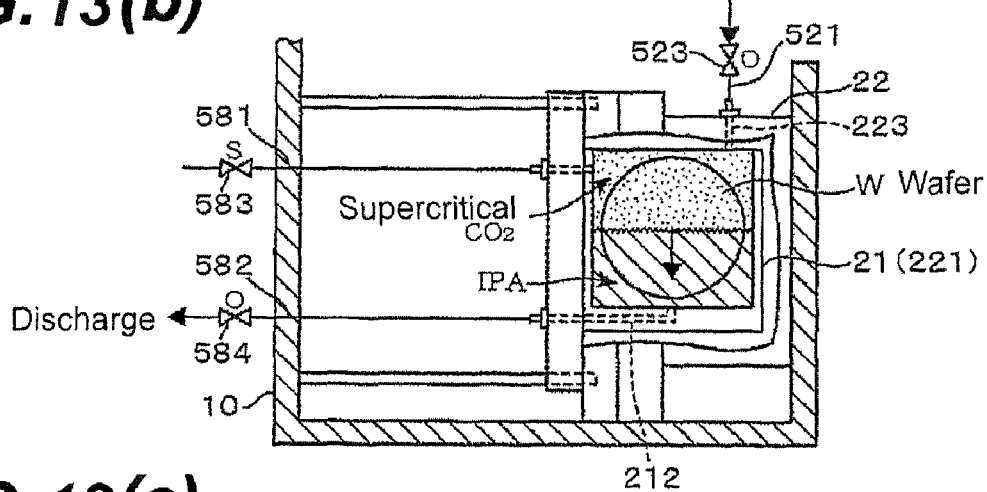
Figure 13C:
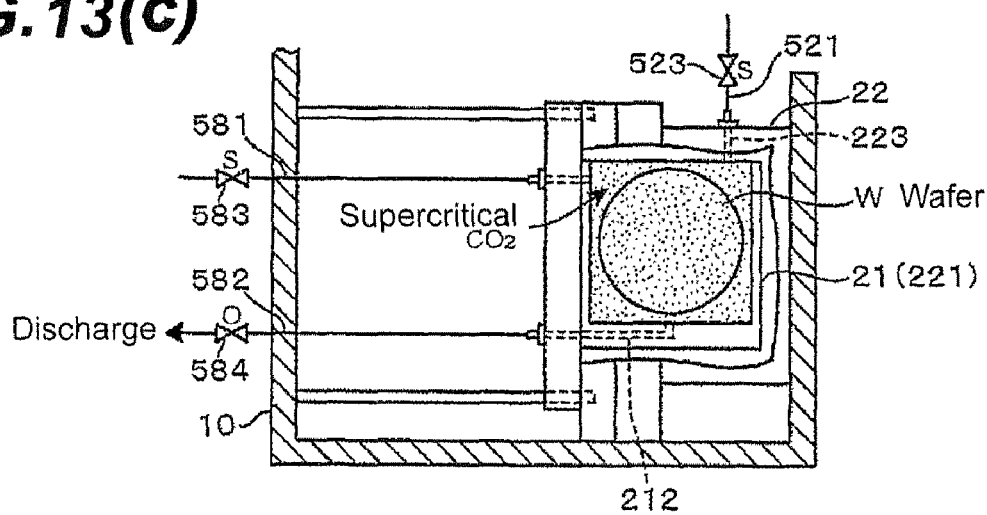

Now, referring to FIG. 13(a) to FIG. 13(c), wafer processing apparatus 2 will be explained which performs a wafer cleaning process at a state where cleaning bath 21 is accommodated within supercritical drying vessel 22, similar to above-described wafer processing apparatus 2. Wafer processing apparatus 2 shown in FIG. 13(a) to FIG. 13(c) has a substantially similar configuration to wafer processing apparatus 2 shown in FIG. 1 to FIG. 10, and accommodates wafer W in a vertical direction to perform a cleaning process or a supercritical drying process. Wafer processing apparatus 2 shown in FIG. 13(*a*) to FIG. 13(*c*) differs from the above-described wafer processing apparatus 2 in that an internal flow channel 213 is arranged to penetrate through flange 211 and the upper portion of the side wall of cleaning bath 21, a first supply line 521 for supplying a cleaning solution or a rinse solution is connected to internal flow channel 213, and a discharge line 582 (fluid discharge unit) for an exclusive discharge of a cleaning solution or supercritical $CO_2$ is connected to internal flow channel 212 formed at the bottom of cleaning bath 21.

In wafer processing apparatus 2 according to the exemplary embodiment of the present disclosure, wafer W is received from wafer transport mechanism 3 and accommodated in cleaning bath 21, and cleaning bath 21 is slid into supercritical drying vessel 22. Subsequently, as shown in FIG. 13(*a*), each of open/close valves 583, 584 of first flow channel 581 and discharge line 582 is opened (O) to supply SC1 solution from first flow channel 581 and a wafer cleaning process begins. In order to make the inside of cleaning bath 21 filled with SC1 solution, the amount of SC1 supplied from first flow channel 581 may be bigger than the amount of SC1 discharged from discharge line 582. Furthermore, second flow channel 521 may be opened to the atmosphere for evacuation.

When cleaning bath 21 is filled with SC1 solution, the amount of SC1 supplied from first flow channel 581 and the amount of SC1 discharged from discharge line 582 are balanced each other, and open/close valve 523 of second flow channel 521 is shut (S) to continue a cleaning process using an alkaline chemical solution. Subsequently, inside of cleaning bath 21 is filled with a variety of chemical solutions and rinse solutions replaced in such sequence as DIW→DHF→DIW to perform a cleaning process, and the inside of cleaning bath 21 is replaced with IPA at the last stage, thus completing the cleaning process.

Upon completing the cleaning process, open/close valve 583 of first flow channel 581 is closed (S), and open/close valve 523 of second flow channel 521 is opened (O) to supply supercritical state $CO_2$ and IPA is extruded from the inside of cleaning bath 21 to discharge line 582, to perform a supercritical drying process for wafer W, as shown in FIG. 13(*b*). When the replacement with supercritical $CO_2$ in cleaning bath 21 is completed, open/close valve 523 of second flow channel 521 is closed (S) to stop the supply of supercritical $CO_2$, and discharge supercritical $CO_2$ from discharge line 582, thereby completing the supercritical drying process. (FIG. 13(*c*)) According to wafer processing apparatus 2 of the exemplary embodiment of the present disclosure, the cleaning process is performed at a state where cleaning bath 21 is accommodated in supercritical drying vessel 22, thus preventing the outer wall surface of cleaning bath 21 from contacting a cleaning solution or a rinse solution, and preventing cleaning bath 21 from being contaminated.

In the above-described exemplary embodiments, $CO_2$ is supplied with a supercritical state to replace the liquid (for example, IPA) in which wafer W is immersed, thereby obtaining a dry wafer W. However, the supercritical fluid employed in the supercritical drying process is not limited to $CO_2$. For instance, hydrofluoroethers (hereinafter, referred to as "HFE") may be used in place of $CO_2$.

Figure 14A:
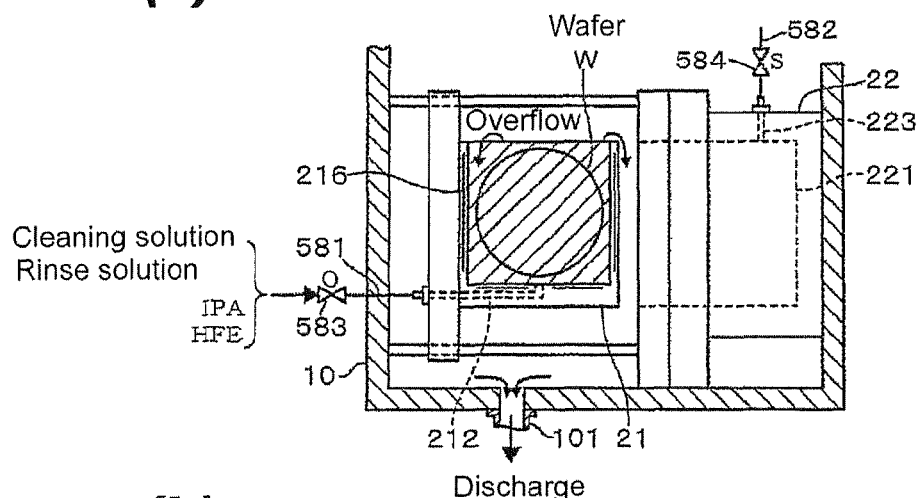
FIG. 14(c) is an explanatory view illustrating an example of the wafer processing apparatus which uses HFE as a liquid for obtaining a supercritical fluid.
Figure 14B:
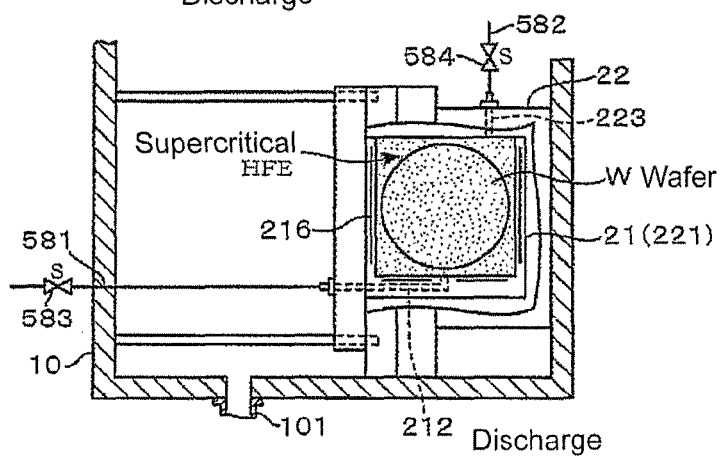
Figure 14C:
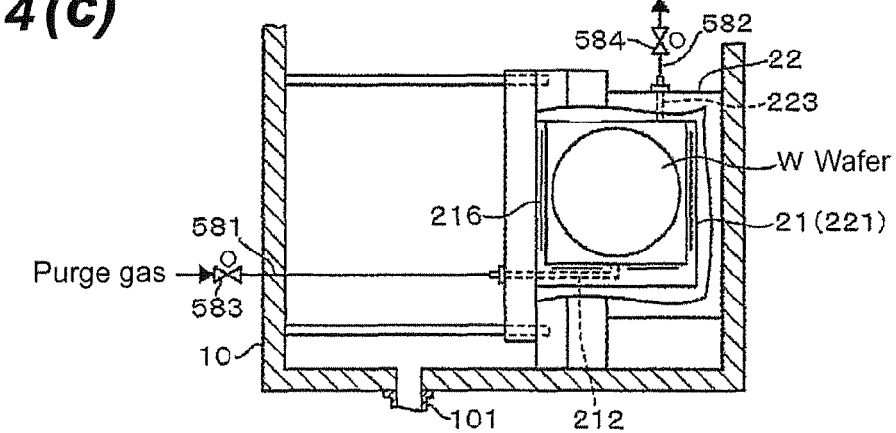
Figure 15A:
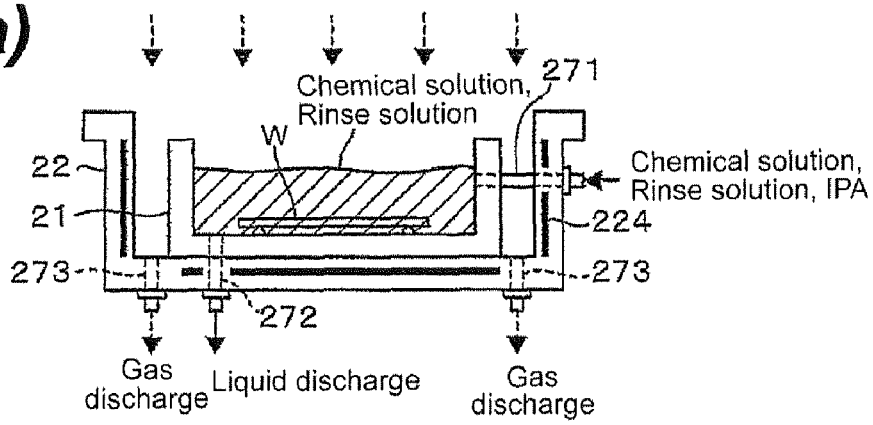
FIG. 15(d) is an explanatory view illustrating an example of the wafer processing apparatus in which the cleaning bath is fixed within the supercritical drying vessel.
Figure 15B:
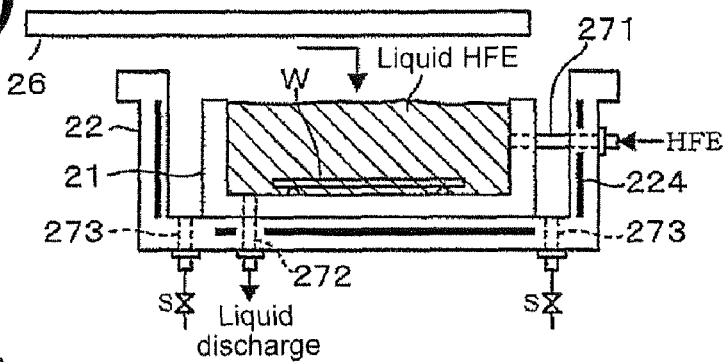
Figure 15C:
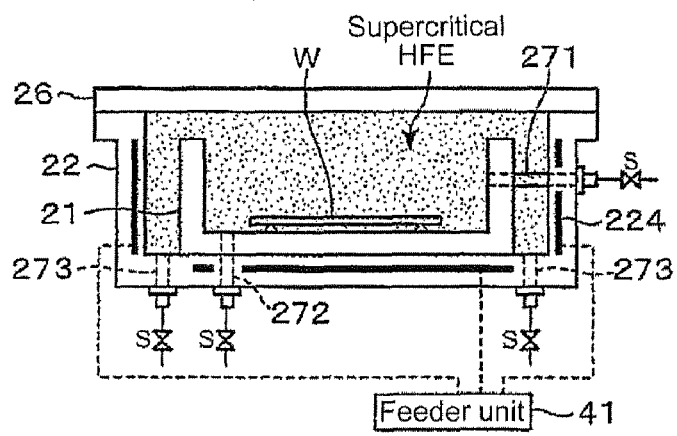
Figure 15D:
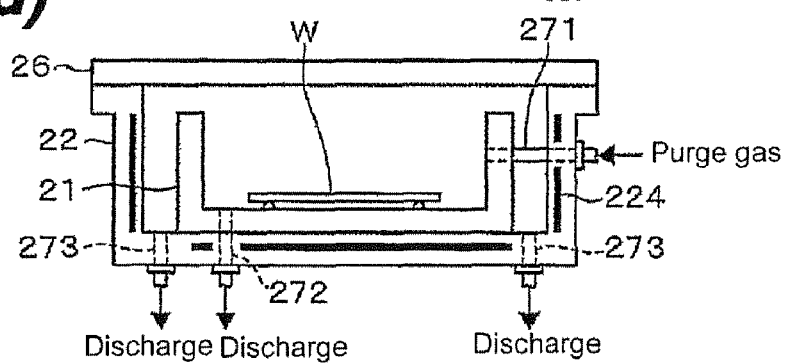

FIG. 14(*a*) to FIG. 14(*c*) illustrate an example of wafer processing apparatus 2 which utilizes HFE as a supercritical fluid. Wafer processing apparatus 2 shown in FIG. 14(*a*) to FIG. 14(*c*) has a substantially similar configuration to wafer processing apparatus 2 shown in FIG. 1 to FIG. 10, but differs in that liquid state HFE is supplied from first flow channel 581 and internal flow channel 223 of supercritical drying vessel 22 is connected to discharge line 582 (fluid discharge unit). Here, first flow channel 581 serves as a fluid supply unit for supplying HFE which is a liquid for obtaining a supercritical fluid to cleaning bath 21. Also, a heater 216, for example, is arranged at the bottom or side wall of cleaning bath 21 for heating HFE in cleaning bath 21. Heater 216 serves as a heating unit which turns liquid HEF into a supercritical state and maintains the supercritical state.

Now, referring to FIG. 14(*a*), in wafer processing apparatus 2 according to the exemplary embodiment of the present disclosure, various chemical solutions and rinse solutions are overflowed and processes are carried out in a sequence of cleaning with an alkaline chemical solution (SC1 solution)→rinsing (DIW)→cleaning with an acid chemical solution (DHF solution)→rinsing (DIW)→IPA replacement, while cleaning bath 21 is extracted to the front side of supercritical drying vessel 22. In addition, liquid state HFE is supplied from first flow channel to cleaning bath 21 filled with IPA, and cleaning bath 21 filled with the HFE is moved into supercritical drying vessel 22.

Although not shown in FIGS. 14(*a*) to 14(*c*), storage space 221 of supercritical drying vessel 22 of the exemplary embodiment of the present disclosure is larger than cleaning bath 21. When cleaning bath 21 is stored in storage space 221, a gap having a size of, for example, 20% of the total volume of storage space 221 is formed above cleaning bath 21. When heater 216 operates at such a state, the inside of cleaning bath 21 and the inside of storage space 221 become a high temperature and high pressure to turn HFE to a supercritical state, and a supercritical drying process for wafer W is performed. (FIG. 14(*b*))

Subsequently, open/close valve 584 of discharge line 582 is opened (O) to discharge supercritical state HFE, and a dry wafer W may be extracted (FIG. 14(*c*)). Here, purge gas may be supplied from first flow channel 581. In this exemplary embodiment that utilizes HFE as a supercritical fluid, surface of wafer W is dried without forming a liquid-gas interface, as the environment of the wafer surface changes in the order of liquid for obtaining a supercritical fluid (liquid HFE)→supercritical fluid (supercritical HFE).

Although the above-described exemplary embodiments are configured in such a way that cleaning bath 21 can be extracted to the outside of supercritical drying vessel, cleaning bath 21 may be fixed inside supercritical drying vessel 22. FIG. 15(*a*) to FIG. 15(*d*) illustrate an exemplary embodiment where cleaning bath 21 which accommodates wafer W in a horizontal direction is fixed in supercritical drying vessel 22.

As shown in FIG. 15(*a*), in wafer processing apparatus 2 according to this exemplary embodiment, a cleaning solution or a rinse solution is supplied from a cleaning solution supply line 271, and the cleaning solution is discharged from a discharge line 272, thereby performing a cleaning process without causing overflow of the cleaning solution from supercritical drying vessel 22.

Further, during the cleaning process, the top surfaces of cleaning bath 21 and supercritical drying vessel 22 may be opened to introduce a downflow of a clean air from the opening of supercritical drying vessel 22 to the space formed between the side wall of cleaning bath 21 and the side wall of supercritical drying vessel 22. The downflow may be evacuated through a discharge line 273 formed at the bottom surface of supercritical drying vessel 22. As the downflow of the clean air is formed around cleaning bath 21, the steam of the chemical solution supplied to cleaning bath 21 may be prevented from being diffused to the surroundings.

When the cleaning process is thus-completed, the inside of cleaning bath 21 is replaced with IPA, and the IPA is replaced with HFE. After that, cleaning solution supply line 271 and discharge lines 272, 273 are closed (S), and supercritical drying vessel 22 is sealed with a cover 26 serving as a partitioning member. (FIG. 15(b)) Subsequently, heater 224 arranged at the side wall and bottom surface of supercritical drying vessel 22 is supplied with electrical power from a feeder unit 41, to heat the inside of supercritical drying vessel 22 and the inside of cleaning bath 21, thereby turning HFE into a supercritical state and drying wafer W. (FIG. 15 (c)) Then, each of discharge lines 272, 273 is opened (O) to discharge HFE, and dry wafer W may be extracted. (FIG. 15(d)). In this exemplary embodiment, cleaning solution supply line 271 serves as a fluid supply unit for supplying HFE which is a liquid for obtaining a supercritical liquid, and discharge lines 272, 273 serve as a fluid discharge unit.

FIG. 16(a) to FIG. 16(d) illustrate an exemplary embodiment of wafer processing apparatus 2 in which cleaning bath 21 is fixed within supercritical drying vessel 22, and a cleaning process is performed with cleaning bath 21 and supercritical drying vessel 22 filled with a cleaning solution or a rinse solution. The wafer processing apparatus of this exemplary embodiment differs from the wafer processing apparatus shown in FIG. 15, in that cleaning solution supply line 271 is formed on the bottom surface of cleaning bath 21, cover 26 has a gas flow channel 261 connected to the external atmosphere of supercritical drying vessel 22, and discharge line 273 is formed only at the bottom surface of supercritical drying vessel 22.

In wafer processing apparatus 2 of this exemplary embodiment, a chemical solution (for example, SI1 solution) is started to be supplied after wafer W is accommodated in cleaning bath 21 and cover 26 is closed. Subsequently, the chemical solution is overflowed from cleaning bath 21, and the amount of chemical solution discharged from discharge line 273 is adjusted to fill the entire area of the inside of supercritical drying vessel 22, that is, the entire area of the inside of cleaning bath 21 and the entire area of the space around cleaning bath 21 with the cleaning solution. Here, gas flow channel 261 may be communicated with the external atmosphere to discharge the gas from the inside of supercritical drying vessel 2 to the outside and replace the gas with the cleaning solution.

Figure 16A:
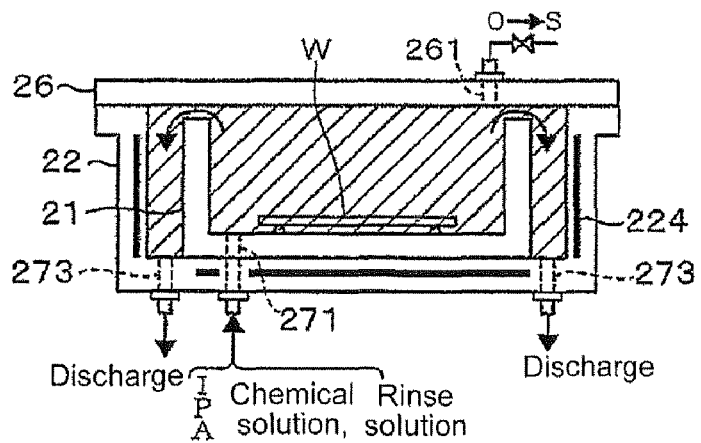
FIG. 16(a), FIG. 16(b), FIG. 16(c) and FIG. 16(d) is an explanatory view illustrating another example of the wafer processing apparatus in which the cleaning bath is fixed within the supercritical drying vessel.
Figure 16B:
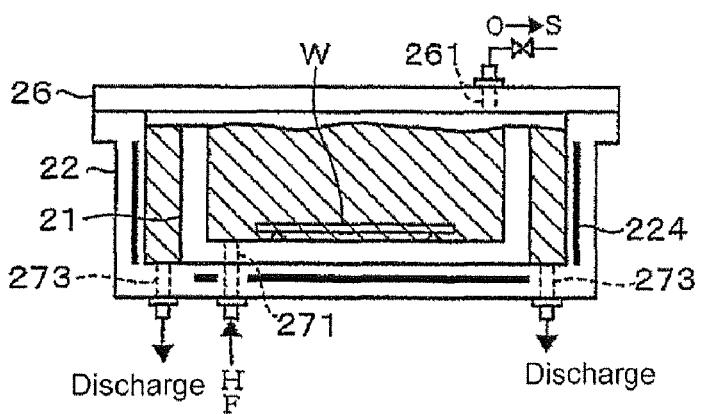
Figure 16C:
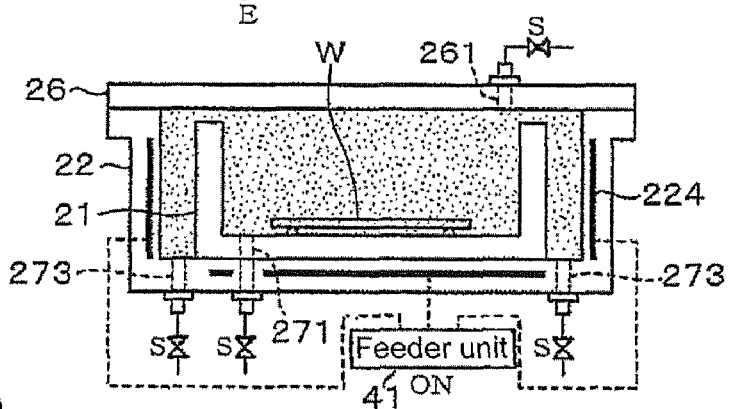
Figure 16D:
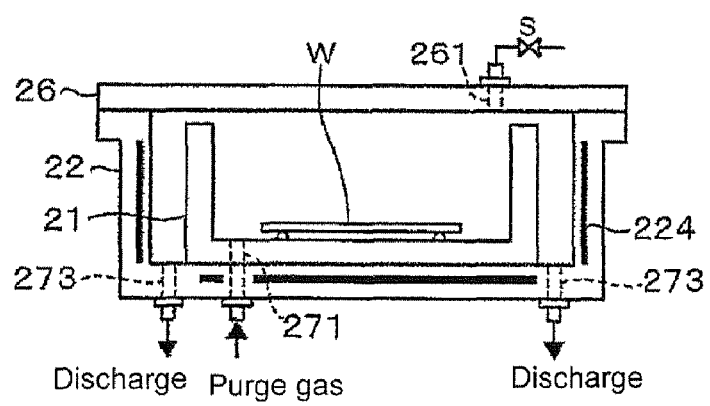

As shown in FIG. 16(a), when supercritical drying vessel 22 is filled with the cleaning solution, gas flow channel 261 is closed to allow the amount of supplied cleaning solution and the amount of discharged cleaning solution to be balanced with each other. And cleaning solution supply line 271 supplies liquids in the sequence of SC1 solution→DIW→DHF solution→DIW to perform the cleaning process. In this exemplary embodiment, the cleaning solution and the rinse solution overflow from cleaning bath 21 to pass through the space between the side wall of cleaning bath and the side wall of supercritical drying vessel 22, and are discharged from discharge line 273. As a result, the surfaces of cleaning bath 21 and supercritical drying vessel 22 which are brought into contact with the cleaning solution and the rinse solution are cleaned, thereby enabling a wafer drying process to be performed under a clean environment.

When the cleaning process is completed, IPA is supplied to the inside of supercritical drying vessel 22, and IPA is then replaced with HFE. In addition, gas flow channel 261 is temporarily opened to take in an external atmosphere and adjust the liquid level of HFE, such that 80% of the internal volume of supercritical drying vessel 22 can be filled with HFE (FIG. 16(b)). After that, all of flow channels 271, 273, 261 are closed, and electrical power is supplied from feeder unit 41 to heater 224 which thus heats the inside of supercritical drying vessel 22 and the inside of cleaning bath 21, thereby converting HFE into a supercritical state and drying wafer W (FIG. 16(c)). Subsequently, each discharge line 273 is opened to discharge HFE and a dry wafer W is extracted (FIG. 16(d)). In this exemplary embodiment, cleaning solution supply line 271 serves as a fluid supply unit for supplying HFE which is a liquid for obtaining a supercritical liquid, and discharge line 273 serves as a fluid discharge unit.

According to the exemplary embodiments as shown in FIG. 15(a) to FIG. 15(d) and FIG. 16(a) to FIG. 16(d), cleaning bath 21 is fixed within supercritical drying vessel 22, which eliminates the need of a large scale driving mechanism for moving the entire cleaning bath 21. Although exemplary embodiments described above are configured such that wafer W is accommodated in a horizontal direction within cleaning bath 21, wafer W may also be accommodated in a vertical direction within cleaning bath 21, and such a cleaning bath 21 could be fixed in supercritical drying vessel 22, as shown in FIG. 6.

In the foregoing exemplary embodiments, $CO_2$ and HFE are employed as a supercritical fluid for a supercritical drying process, or as a liquid for obtaining a supercritical fluid. However, applicable fluids to the relevant processes of the present disclosure are not limited to those fluids. Further, in the above-described exemplary embodiments, while boost pump 532 (pressurizing unit) is employed to pressurize the inside of cleaning bath 21, or heaters 216, 224 are employed to heat the inside of cleaning bath 21 so as to convert a fluid into a supercritical state or maintain the supercritical state, the pressurizing unit and the heating unit may be combined to turn a fluid into a supercritical state or maintain the supercritical state.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a cleaning bath which accommodates a substrate therein, and cleans the substrate by a cleaning solution flowing therethrough;
   a processing vessel which accommodates the cleaning bath therein, and performs a supercritical fluid processing onto the substrate; and
   a driving unit configured to move the cleaning bath and the processing vessel relative to each other so as to select between one of states where the cleaning bath is disposed outside the processing vessel and where the cleaning bath is disposed inside the processing vessel,
   wherein the cleaning bath is mounted with a cover part for closing the processing vessel, and the driving unit drives the cleaning bath and the processing vessel relative to with each other so that the cleaning bath is introduced into the processing vessel to close the processing vessel by the cover part, and the cleaning bath is extracted from the processing vessel to open the processing vessel.

2. The substrate processing apparatus of claim 1, further comprising:
   a fluid supply unit configured to supply a liquid for obtaining a supercritical fluid, or supply a supercritical fluid into the cleaning bath; and a fluid discharge unit configured to discharge fluid from the cleaning bath.

3. The substrate processing apparatus of claim 2, further comprising a heating unit configured to heat the liquid for obtaining a supercritical fluid to turn the liquid into a supercritical state, or heat the supercritical fluid to maintain the supercritical fluid at a supercritical state.

4. The substrate processing apparatus of claim 2, further comprising a pressurizing unit configured to pressurize the liquid for obtaining a supercritical fluid to turn the liquid into a supercritical state, or pressurize the supercritical fluid to maintain the supercritical fluid at a supercritical state.

5. The substrate processing apparatus of claim 1, wherein cleaning of a substrate is performed at the state where the cleaning bath is disposed outside the processing vessel.

6. The substrate processing apparatus of claim 1, wherein cleaning of a substrate is performed at the state where the cleaning bath is disposed inside the processing vessel, and the substrate is transferred to the cleaning bath at the state where the cleaning bath is disposed outside the processing vessel.

7. A substrate processing apparatus comprising:
    a cleaning bath which accommodates a substrate therein, and cleans the substrate by a cleaning solution flowing therethrough; and
    a processing vessel which accommodates the cleaning bath therein, and performs a supercritical fluid processing onto the substrate,
    wherein the cleaning bath is disposed inside the processing vessel, and the processing vessel has an inlet/outlet port which is opened/closed by a partitioning member so that the substrate is transferred between the outside of the processing vessel and the cleaning bath via the inlet/outlet port.

8. A substrate processing apparatus of claim 1, wherein an upper side of the cleaning bath is opened to accommodate the substrate in a vertical direction.

9. A substrate processing apparatus comprising:
    a liquid processing unit configured to clean a substrate accommodated therein by supplying a cleaning liquid to the substrate;
    a processing vessel which accommodates the liquid processing unit therein, and performs a supercritical fluid processing onto the substrate; and
    a driving unit configured to move the liquid processing unit and the processing vessel relative to each other so as to select between one of states where the liquid processing unit is disposed outside the processing vessel and where the liquid processing unit is disposed inside the processing vessel,
    wherein the liquid processing unit is mounted with a cover part for closing the processing vessel, and the driving unit drives the liquid processing unit and the processing vessel relative to each other so that the liquid processing unit is introduced into the processing vessel to close the processing vessel by the cover part, and the liquid processing unit is extracted from the processing vessel to open the processing vessel.

10. The substrate processing apparatus of claim 9, further comprising:
    a fluid supply unit configured to supply a liquid for obtaining a supercritical fluid, or supply a supercritical fluid into the liquid processing unit; and
    a fluid discharge unit configured to discharge fluid from the liquid processing unit.

11. The substrate processing apparatus of claim 10, further comprising a heating unit configured to heat the liquid for obtaining a supercritical fluid to turn the liquid into a supercritical state, or heat the supercritical fluid to maintain the supercritical fluid at a supercritical state.

12. The substrate processing apparatus of claim 10, further comprising a pressurizing unit configured to pressurize the liquid for obtaining a supercritical fluid to turn the liquid into a supercritical state, or pressurize the supercritical fluid to maintain the supercritical fluid at a supercritical state.

13. The substrate processing apparatus of claim 9, wherein cleaning of the substrate is performed at the state where the liquid processing unit is disposed outside the processing vessel.

14. The substrate processing apparatus of claim 9, wherein cleaning of the substrate is performed at the state where the liquid processing unit is disposed inside the processing vessel, and the substrate is transferred to the liquid processing unit at the state where the liquid processing unit is disposed outside the processing vessel.

15. A substrate processing apparatus of claim 9, wherein an upper side of the liquid processing unit is opened to accommodate the substrate in a vertical direction.

\* \* \* \* \*